United States Patent
Shin et al.

(10) Patent No.: US 10,081,870 B2
(45) Date of Patent: *Sep. 25, 2018

(54) PLASMA ENHANCED CHEMICAL VAPOR DEPOSITION APPARATUS AND METHOD FOR CONTROLLING THE SAME

(75) Inventors: Jinhyouk Shin, Changwon-si (KR);
Jeonggyu Kim, Changwon-si (KR);
Kwangho Lee, Changwon-si (KR);
Jangwoo Lee, Changwon-si (KR);
Moonkap Lee, Changwon-si (KR);
Junggeun Oh, Changwon-si (KR)

(73) Assignee: LG ELECTRONICS INC., Seoul (KR)

( * ) Notice: Subject to any disclaimer, the term of this patent is extended or adjusted under 35 U.S.C. 154(b) by 1018 days.

This patent is subject to a terminal disclaimer.

(21) Appl. No.: 14/007,254

(22) PCT Filed: Mar. 16, 2012

(86) PCT No.: PCT/KR2012/001910
§ 371 (c)(1),
(2), (4) Date: Sep. 24, 2013

(87) PCT Pub. No.: WO2012/134083
PCT Pub. Date: Oct. 4, 2012

(65) Prior Publication Data
US 2014/0014038 A1    Jan. 16, 2014

(30) Foreign Application Priority Data

Mar. 25, 2011 (KR) .................. 10-2011-0026857
Dec. 22, 2011 (KR) .................. 10-2011-0140040

(51) Int. Cl.
*C23C 16/513*     (2006.01)
*C23C 16/458*     (2006.01)
(Continued)

(52) U.S. Cl.
CPC .......... *C23C 16/513* (2013.01); *C23C 16/458* (2013.01); *C23C 16/50* (2013.01);
(Continued)

(58) Field of Classification Search
USPC ....... 118/723 E, 723 ER; 156/345.43–345.47
See application file for complete search history.

(56) References Cited

U.S. PATENT DOCUMENTS 5,248,028 A * 9/1993 Weiblen .............. H01L 21/4867
198/803.14
5,372,648 A    12/1994 Yamamoto et al. ...... 118/723 E
(Continued)

FOREIGN PATENT DOCUMENTS

CN     100374617 C    3/2008
CN     101298669 A    11/2008
(Continued)

OTHER PUBLICATIONS

European Office Action dated Feb. 9, 2016 issued in Application No. 12763606.6.
(Continued)

*Primary Examiner* — Jeffrie R Lund
*Assistant Examiner* — Mirza Israr Javed
(74) *Attorney, Agent, or Firm* — KED & Associates, LLP

(57) ABSTRACT

There is disclosed a plasma enhanced chemical vapor deposition apparatus including a chamber in which plasma reaction is performed to provide a functional film to an object received therein, a pallet mechanically and electrically connected with the object, a conveyer to convey the pallet to an inside from an outside of the chamber, and a power supplier to supply an electric power to the pallet, the power supplier comprising a moving contact distant from the pallet when the pallet is conveyed and contacting with the pallet when the pallet is stopped.

11 Claims, 10 Drawing Sheets

(51) Int. Cl.
*C23C 16/50* (2006.01)
*C23C 16/54* (2006.01)
*H01J 37/32* (2006.01)
*C23C 14/24* (2006.01)
*C23C 16/448* (2006.01)
*C23C 16/455* (2006.01)
*C23C 14/56* (2006.01)

(52) U.S. Cl.
CPC .......... *C23C 16/54* (2013.01); *H01J 37/3244* (2013.01); *H01J 37/32706* (2013.01); *H01J 37/32715* (2013.01); *H01J 37/32743* (2013.01); *H01J 37/32788* (2013.01); *H01J 37/32862* (2013.01); *C23C 14/24* (2013.01); *C23C 14/243* (2013.01); *C23C 14/56* (2013.01); *C23C 14/562* (2013.01); *C23C 14/568* (2013.01); *C23C 16/4485* (2013.01); *C23C 16/45548* (2013.01)

(56) References Cited

U.S. PATENT DOCUMENTS

| | | | | |
|---|---|---|---|---|
| 5,603,399 | A * | 2/1997 | Mannlein | B65G 17/36 198/803.11 |
| 6,321,904 | B1 * | 11/2001 | Mitchell | B65G 15/42 198/690.2 |
| 6,338,777 | B1 | 1/2002 | Longstreth White | 204/192.15 |
| 6,461,444 | B1 * | 10/2002 | Nishio | C23C 16/46 134/2 |
| 7,021,453 | B2 * | 4/2006 | Hartness | B65G 17/323 198/476.1 |
| 2003/0232150 | A1 | 12/2003 | Arnold et al. | 427/569 |
| 2005/0060823 | A1 * | 3/2005 | Lord | B65G 17/44 15/77 |
| 2005/0103271 | A1 | 5/2005 | Watanabe et al. | 118/719 |
| 2005/0221020 | A1 | 10/2005 | Fukiage | |
| 2006/0021576 | A1 | 2/2006 | Nolan et al. | 118/719 |
| 2007/0029046 | A1 * | 2/2007 | Li | C23C 16/4581 156/345.28 |
| 2008/0184933 | A1 * | 8/2008 | Henrich | C23C 16/54 118/719 |
| 2010/0013626 | A1 * | 1/2010 | Park | C23C 16/4583 340/521 |
| 2012/0100288 | A1 * | 4/2012 | White | B05B 12/122 427/180 |
| 2012/0240856 | A1 * | 9/2012 | Oh | C23C 16/54 118/723 R |
| 2012/0260856 | A1 * | 10/2012 | Oh | C23C 16/0236 118/723 R |
| 2012/0264051 | A1 * | 10/2012 | Angelov | H01L 21/683 430/256 |

FOREIGN PATENT DOCUMENTS

| | | |
|---|---|---|
| JP | 2005-520050 | 7/2005 |
| KR | 10-2002-0088029 A | 11/2002 |
| KR | 10-2003-0078456 | 10/2003 |
| KR | 10-2004-0067666 | 7/2004 |
| KR | 10-2009-0084920 A | 8/2009 |
| KR | 10-2010-0018724 A | 2/2010 |
| KR | 10-2010-0096053 A | 9/2010 |
| WO | WO 03/083163 A1 | 10/2003 |

OTHER PUBLICATIONS

International Search Report dated Oct. 12, 2012 issued in Application No. PCT/KR2012/001910.
Chinese Office Action dated Dec. 1, 2014 issued in Application No. 201280015136.9 (with English translation).

* cited by examiner

[Fig. 1]
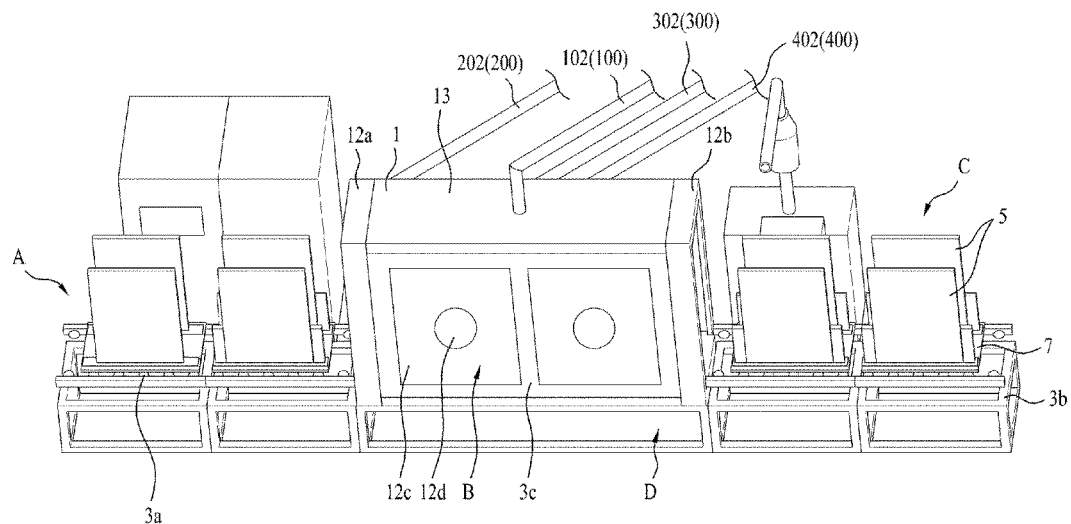
[Fig. 2]
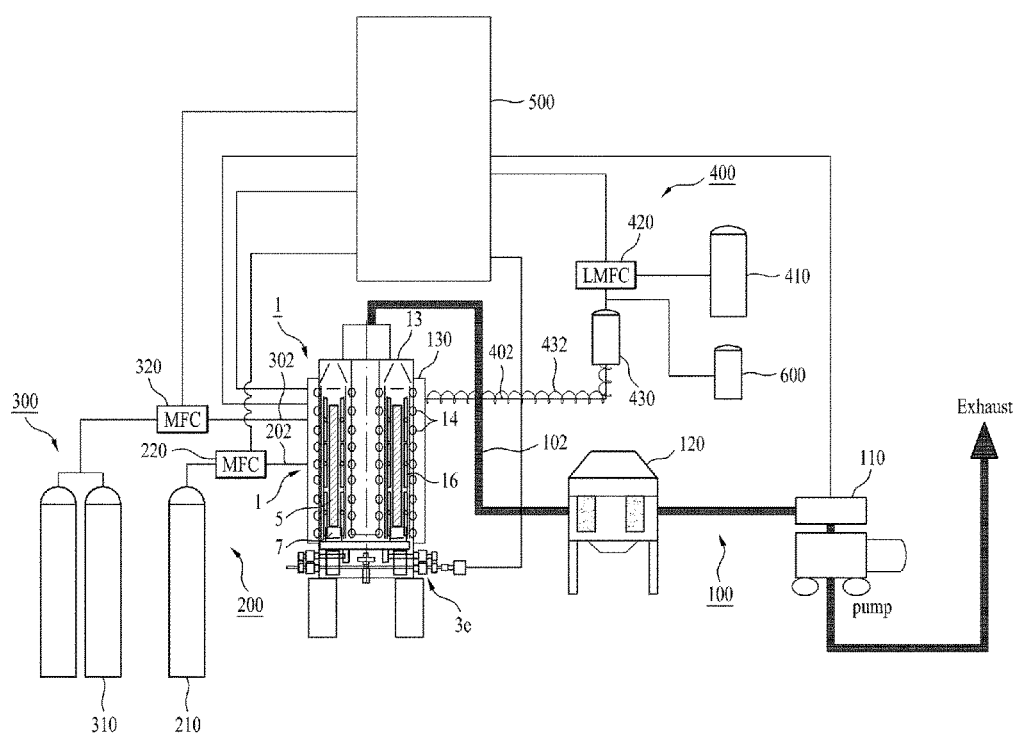

[Fig. 3]
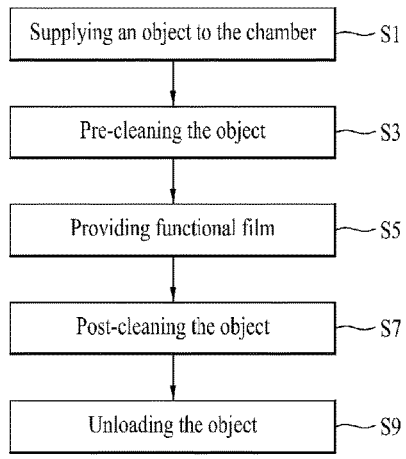
[Fig. 4]
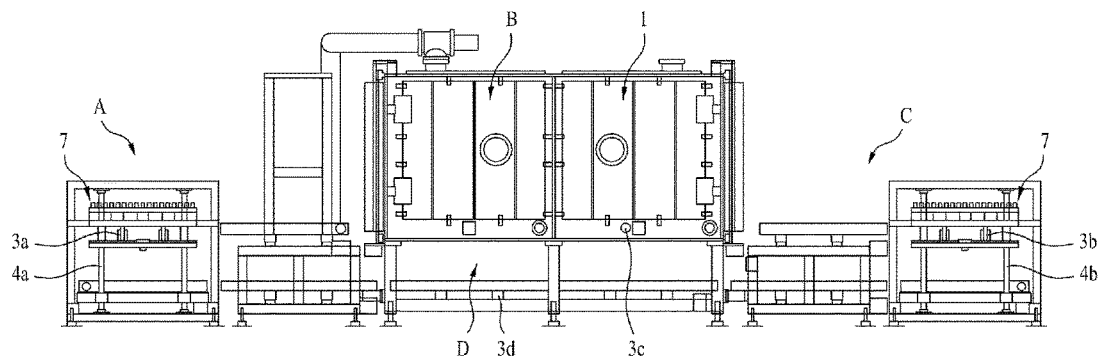
[Fig. 5]
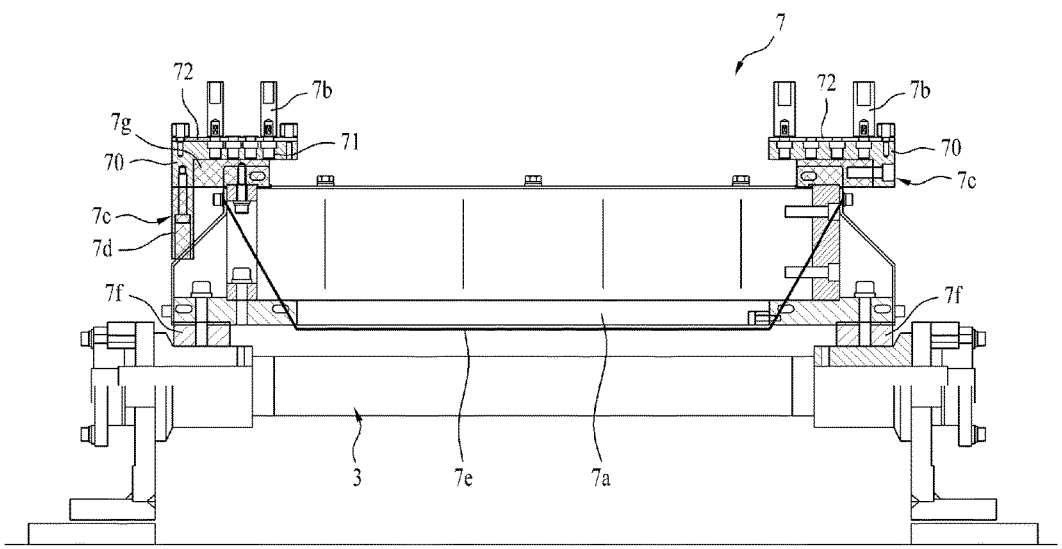

[Fig. 6]
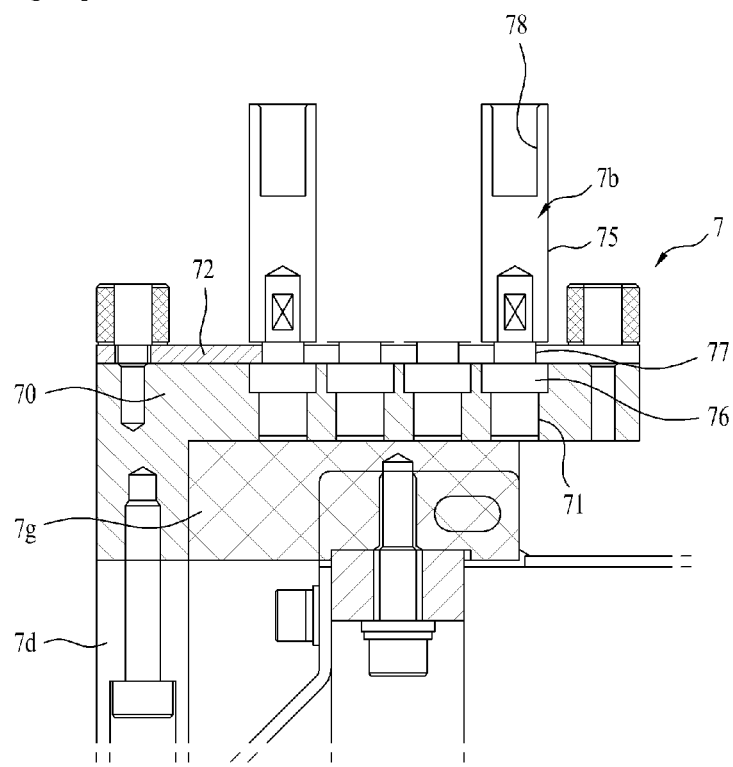
[Fig. 7]
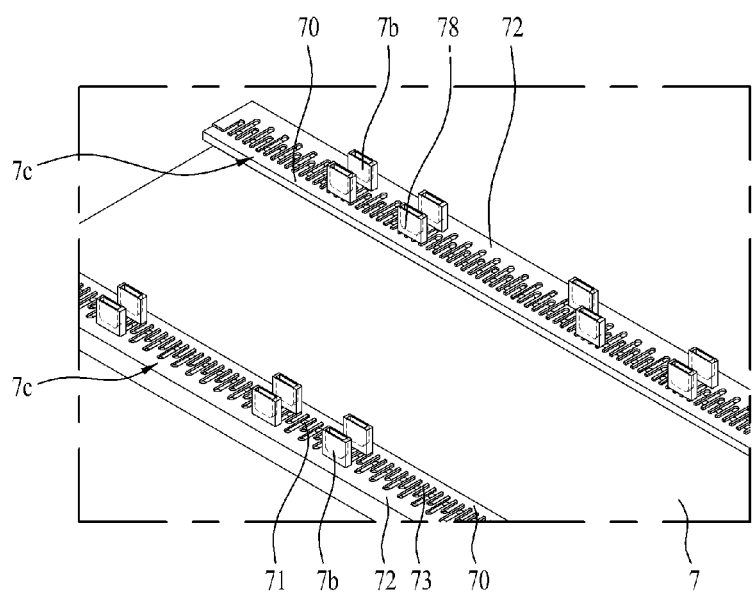

[Fig. 8]
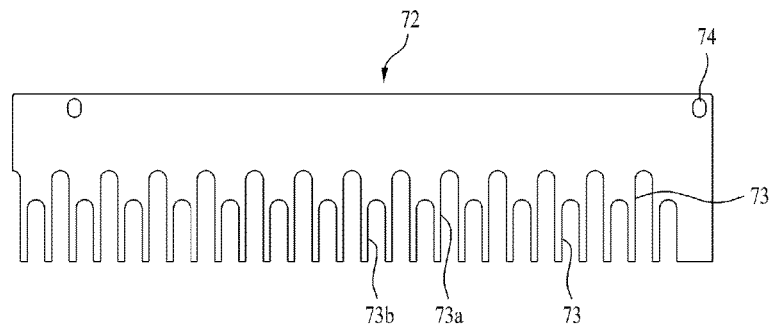
[Fig. 9]
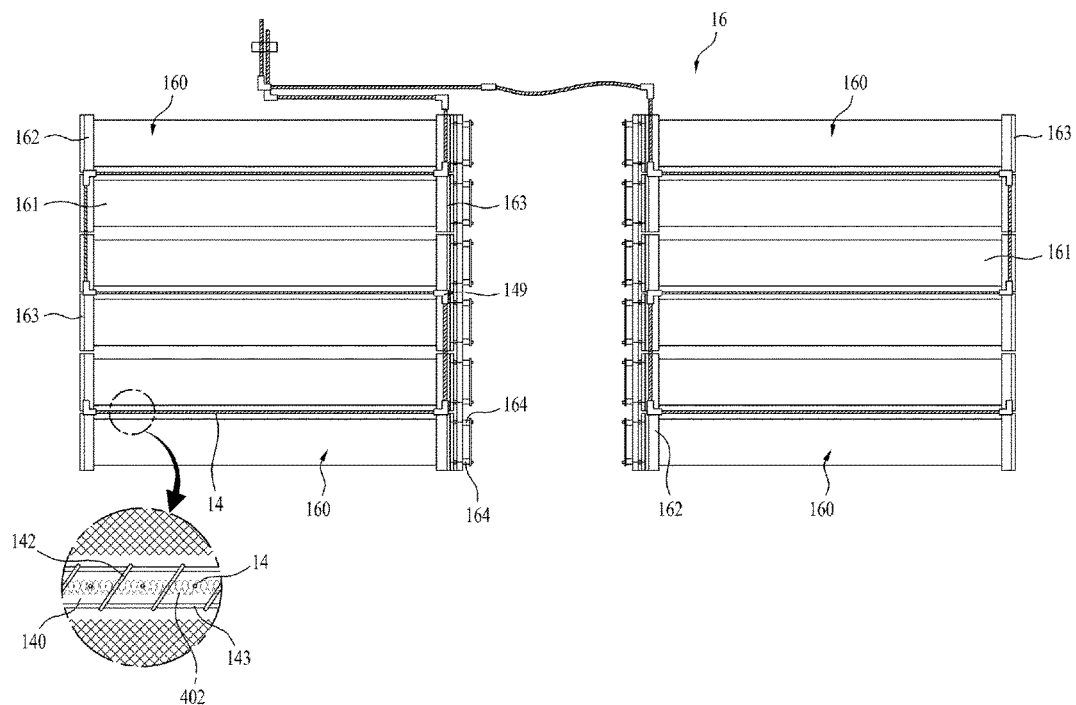
[Fig. 10]
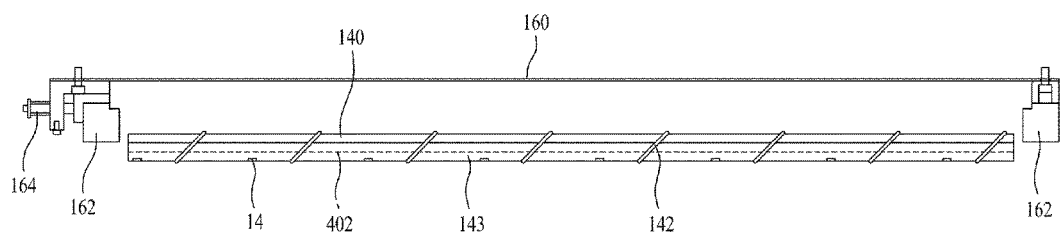

[Fig. 11]
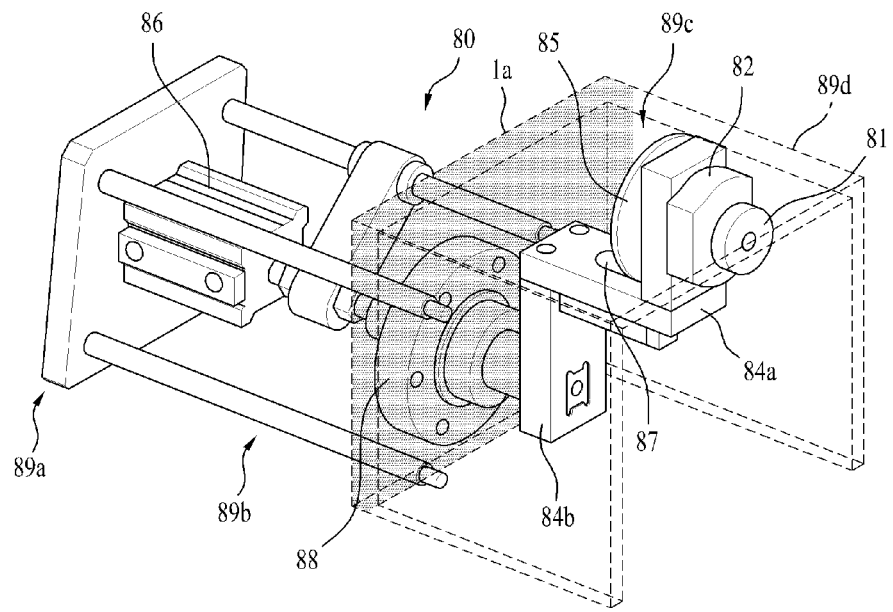
[Fig. 12]
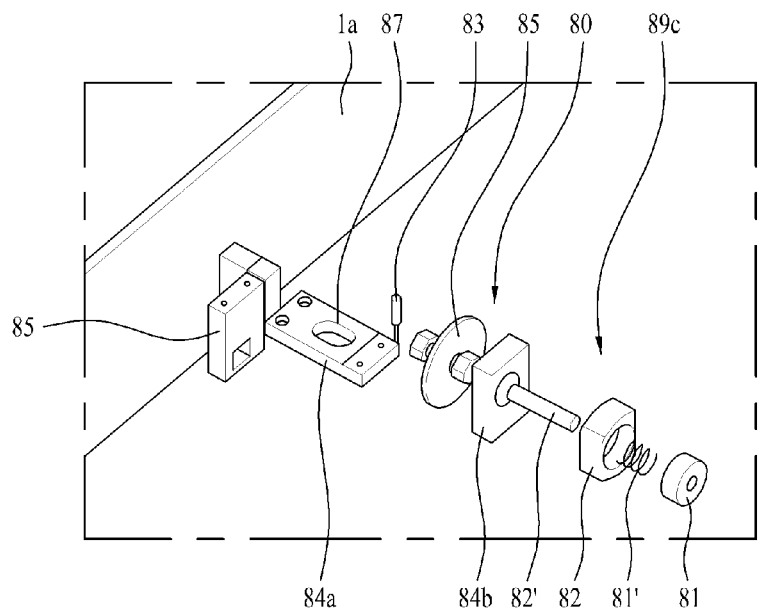

[Fig. 13]
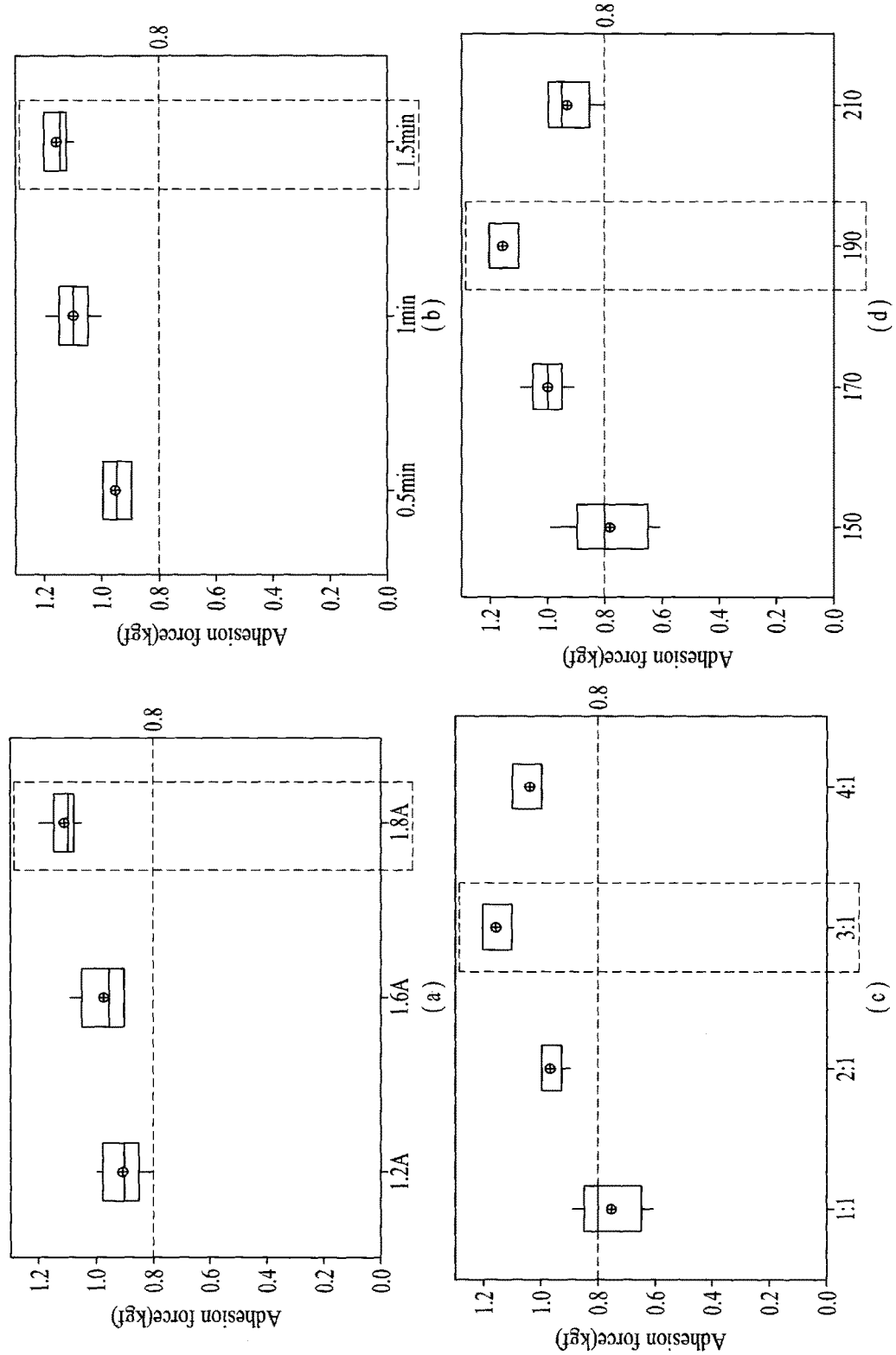

[Fig. 14]
(a)
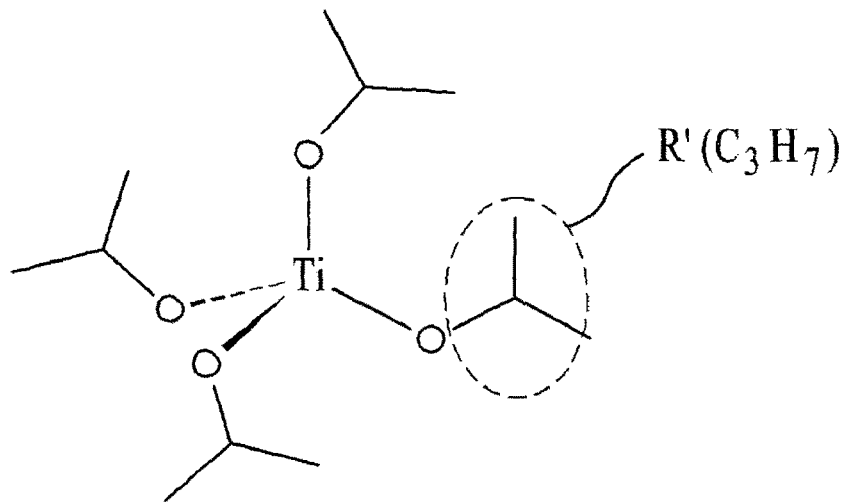
[ Titanium isopropoxide CTT ]
(b)
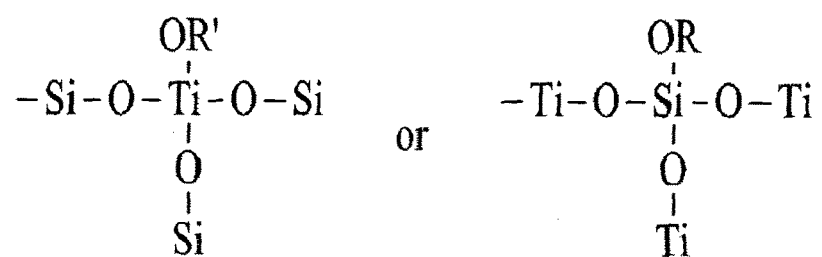
[Structural units of Ti precursor]

[Fig. 15]
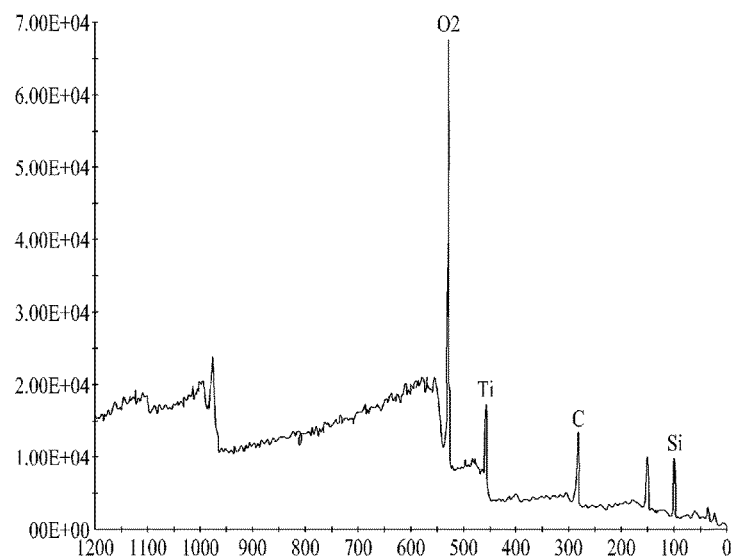
[Fig. 16]
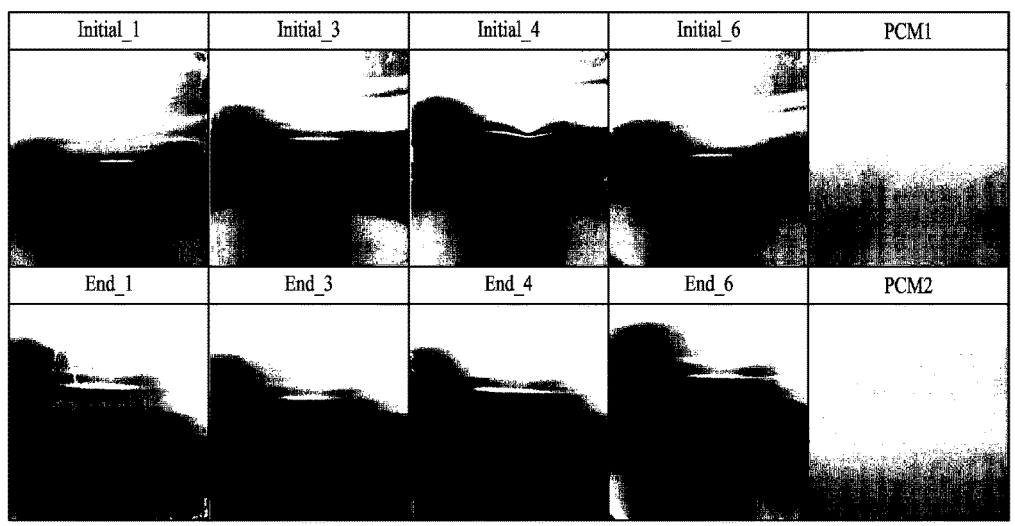

[Fig. 17]
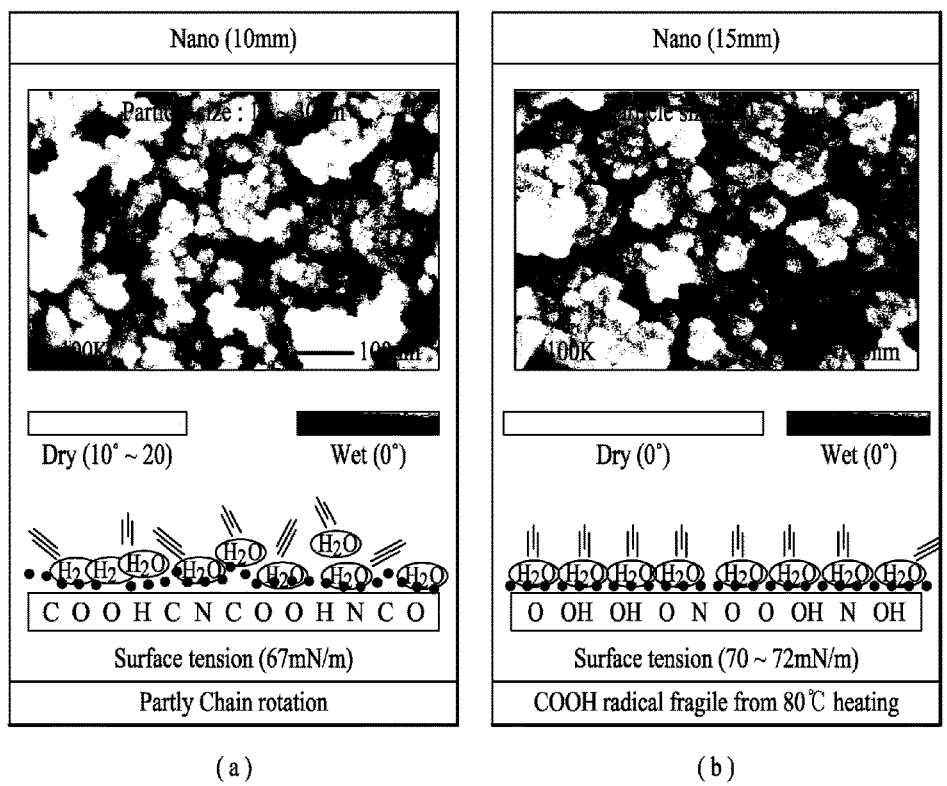
(a)　　　　　　　　　　　(b)
[Fig. 18]
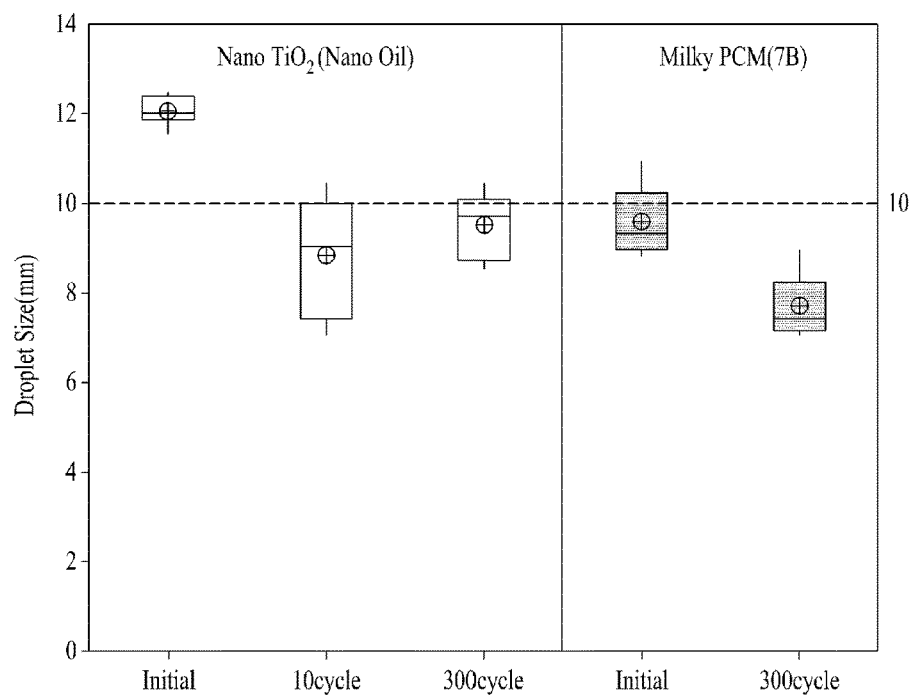

[Fig. 19]
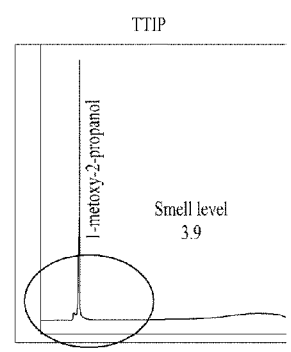
(a)
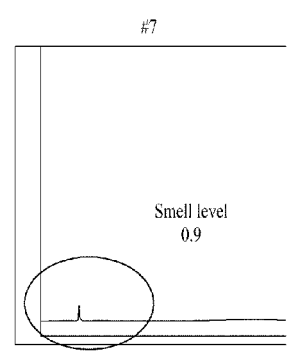
(b)

PLASMA ENHANCED CHEMICAL VAPOR DEPOSITION APPARATUS AND METHOD FOR CONTROLLING THE SAME

This application is a U.S. National Stage Application under 35 U.S.C. § 371 of PCT Application No. PCT/KR2012/001910, filed Mar. 16, 2012, which claims priority to Korean Patent Application Nos. 10-2011-0026857, filed Mar. 25, 2011, and 10-2011-0140040, filed Dec. 22, 2011.

TECHNICAL FIELD

Embodiments may relate to a plasma enhanced chemical vapor deposition apparatus, and more particularly, to an apparatus for providing a functional film with corrosion resistance, hydrophilicity and antibiotic functions, and a method for controlling the apparatus.

In detail, the embodiments of the invention relate to a plasma enhanced chemical vapor deposition (PECVD) apparatus and a method for controlling the same.

BACKGROUND ART

Throughout the industry there have been increasing demands for usage of a film (namely, a functional film) having a specific function that will be formed on a base material. This is because the functional film can compensate for the performance the base material lacks. For example, on a surface of a heat exchanger and a surface of a side mirror for a vehicle may be formed with a functional film having a predetermined function, such as corrosion resistance and hydrophilicity. As one of such examples, a heat exchanger for an air conditioner will be described as follows.

An air conditioner is an electric appliance having a function of controlling a desired temperature and humidity of a predetermined room. Such an air conditioner typically uses a freezing cycle and the freezing cycle, and includes a compressor, an evaporator, an expansion valve and a condenser. The evaporator and the condenser are types of heat exchangers, and they include a tube to enable flow of a refrigerant therein and a cooling fin installed in a tub. In other words, the refrigerant flowing in the evaporator and the condenser heat-exchange heat with ambient air. The evaporator may absorb the heat while evaporating the refrigerant and the condenser may emit the heat while condensing the refrigerant.

However, when a surface temperature of the heat exchanger falls below a dew point, air is condensed and a water droplet is generated on a surface of the heat exchanger. If the water droplet generation is severe, the water droplet is frozen to become a frost. The water droplet and/or the frost generated on the surface of the heat exchanger might cause several problems. For example, the water droplet and/or frost might reduce a heat exchange area to thereby deteriorate the heat exchanging performance of the heat exchanger. Also, the water droplet and/or frost might produce a kind of flow resistance, to increase the power required by a fan used to generate flow of air to the heat exchanger. Accordingly, it is preferable that the water droplet and the like are not condensed on the surface of the heat exchanger. To solve the problem, it has been attempted that the surface of the heat exchanger has hydrophilicity to cause flow of the condensed water droplet down the surface of the heat exchanger.

Meanwhile, a heat exchanger, especially a heat exchanger installed in an outdoor unit of the air conditioner is exposed directly to an outside whereby corrosion might occur as usage time passes. Such a phenomenon might be severe when the heat exchanger is installed in salty conditions such as near a sea shore. Accordingly, it has been proposed that application of a corrosion resistance coating should be performed on a surface of the heat exchanger.

In addition, as the usage time passes, fungus and bacteria inhabit a surface of a heat exchanger and a bad smell might be generated, which might present a sanitary problem. However, the heat exchanger is typically mounted in an indoor or outdoor unit and it is not easy to clean the heat exchanger. As a result, it has been proposed that anti-bacteria/anti-fungi (hereinafter, antibiotic) coating should be provided on the surface of the heat exchanger.

To solve the problems mentioned above, it has been proposed that a functional film should be coated on a surface of a heat exchanger. For example, chrome ($Cr_{+6}$) rust-proofing is performed to a surface of a heat exchanger to provide corrosion resistance to the surface of the heat exchanger and silicate coating is performed on the chrome rust-proofed surface of the heat exchanger to provide hydrophilicity to the surface, such that the surface of the heat exchanger may have corrosion resistance and hydrophilicity. This method is typically called as "Pre-coated material (namely, PCM). However, such a PCM method has a disadvantage of environmental pollution caused by the chrome and another disadvantage of aging that gradually deteriorates hydrophilicity with the passage of time.

To solve those problems of the PCM method, it is proposed that titanium should be coated on the surface of the heat exchanger. As one of proposals, Korean Patent No. 10-2006-32565 is disclosed. That is, to gain a hydrophilic surface, titanium is coated on a surface of a heat exchange through plasma reaction. In this instance, it is difficult to use titanium in the plasma reaction as it is, because the evaporation point of titanium is thousands of degrees. Accordingly, a titanium compound, in other words, a titanium precursor is made to use in the plasma reaction easily. Up until the present time, titanium isopropoxide ($Ti(OC_3H_7)_4$) is used as the titanium precursor. In this instance, to supplement corrosion resistance, hexamethyldisiloane (HMDSO) is coated before the titanium thin film is formed. After that, titanium isopropoxide is used to perform plasma deposition as the titanium precursor. Also, to gain antibiotic function, a precursor is made of a predetermined material such as copper or cobalt that is known to have the antibiotic function and the precursor is used for plasma deposition. In other words, the coating for gaining corrosion resistance, the coating for gaining hydrophilicity and the coating for gaining antibiosis are sequentially performed in that prior art.

Meanwhile, an apparatus having a functional film formed by using conventional plasma enhanced deposition and a method for controlling the same will be described as follows.

First of all, a base material is cleaned in a cleaning chamber. After that, the cleaned base material is deposited in a plasma reaction chamber for plasma reaction and a functional film is generated. The base material having the functional film formed therein is re-cleaned in the cleaning chamber. In other words, according to the conventional plasma enhanced deposition, pre-cleaning, functional film deposition and post-cleaning are performed in various chambers. Also, when forming the functional film, a corrosion resistance layer, a hydrophilicity film and an anti-biotic film are formed in different chambers, respectively. As a result, the conventional plasma enhanced deposition has to include independent chambers to perform each of the processes and each of the processes may be performed in each of the different chambers independently. Accordingly, the apparatus and control method for forming the functional layer might be disadvantageously complex.

Also, the conventional plasma enhanced deposition using conventional functional film forming technology has proposed that the functional film be formed on a raw material before manufacturing a product. In other words, it has been proposed that the functional film should be formed on the surface of the sheet shaped material before the sheet shaped material having the functional film formed thereon is processed to manufacture a radiation fin of the heat exchanger.

However, this has a problem of failing to manufacture the product having the functional film formed in all parts thereof. Also, the functional film is not formed on an area processed from a raw material, for example, a front sectional area, so that corrosion might be partially generated in the front sectional area. Accordingly, reliability of the product might be deteriorated.

To solve the problem, Korean Patent No. 10-2003-0078455 discloses a plasma enhanced chemical vapor deposition apparatus to form a functional film on a product itself.

In the conventional plasma enhanced chemical vapor deposition apparatus, a product is conveyed to a carrier to form the functional layer. An electric power is supplied to the product via the carrier in contact with a pair of rollers. Accordingly, the power supply is quite complex and the electric power is supplied via the rollers so that reliability of power supply might be deteriorated disadvantageously. Also, the functional film is formed on the carrier and efficiency might be deteriorated disadvantageously.

Moreover, the product, that is, the heat exchanger is transferred while being hung on the carrier. Accordingly, the transfer structure is complex and the electric power fails to be supplied between the carrier and the heat exchanger stably and this might cause a problem.

A single electrical connection point has to be formed in the heat exchanger and a uniform functional film cannot be formed in the heat exchanger entirely.

Meanwhile, in the conventional plasma enhanced chemical vapor deposition apparatus, it might not be easy to load and unload the heat exchanger. Accordingly, the work process happens to be inefficient and it might be difficult to install and separate the carrier.

DISCLOSURE OF INVENTION

Technical Problem

Accordingly, embodiments of the invention are directed to a plasma enhanced chemical vapor deposition apparatus and a method for controlling the same. To solve the problems, an object of the embodiments of the invention is to provide an apparatus including a simple and efficient functional layer and a method for controlling the apparatus.

Another object of the embodiments of the invention is to provide an apparatus including a functional film that can be mass-productive by supplying an electric power stably, and a method for controlling the same.

A further object of the embodiments of the invention is to provide an apparatus including a functional film that enables a worker to load and unload a product.

A still further object of the embodiments of the invention is to provide a plasma enhanced chemical vapor deposition apparatus which can supply an electric power more safely and stably by enlarging the area of the contact having the electric power applied thereto.

A still further object of the embodiments of the invention is to provide a plasma enhanced chemical vapor deposition apparatus which can enhance reliability of the contact even with vibration generated by an elastic force and which can supply the electric power more safely.

A still further object of the embodiments is to provide a plasma enhanced chemical vapor deposition apparatus which can prevent unnecessarily formed functional film by minimizing the exposed area of the power supplier exposed in the chamber and which can improve durability by effectively protecting the power supplier.

A still further object of the embodiments is to provide a plasma enhanced chemical vapor deposition apparatus which can provide reliability by providing the safety switch capable of performing power applying and power cut-off based on the moving contact and the moving distance of the moving contact.

Solution to Problem

In an embodiment, an apparatus for manufacturing a plasma-enhanced chemical vapor deposition apparatus having a functional film, the plasma-enhanced chemical vapor deposition apparatus includes a single chamber in which plasma reaction is performed to provide a functional film to a base material; a cleaning gas supply unit to supply cleaning gas to the chamber to clean the base material; a precursor supply unit to supply a precursor to the chamber to form a functional film; an exhaustion unit to exhaust gas inside the chamber outside; and a control unit to control the precursor supply unit, the cleaning gas supply unit and the exhaustion unit to perform a pre-cleaning, functional film supplying and post-cleaning in the chamber.

The functional film may have corrosion resistance and hydrophilicity and it is preferable that the functional film has antibiosis. Also, the functional film is a single layer film.

The functional film may be titanium-oxygen compound and silicon-oxygen compound and it is preferable that the functional film is a titanium oxide and silicon oxide thin film. The titanium oxide is a thin film type and the silicon oxide is a particle type.

Meanwhile, the form the functional film, the precursor uses a titanium-silicon precursor. The precursor may be formed by reacting titanium isopropoxide, silicon and carboxylic acid and the carboxylic acid may be acetic acid.

Meanwhile, the cleaning gas uses the reaction gas supplied to the chamber and the base material may be the heat exchanger.

The apparatus may further include a vaporizer to vaporize the precursor. The temperature of the vaporizer may be 150~210 degrees and the temperature of 190 degrees is preferable. A pipe connecting the vaporizer and the chamber with each other may be heated lower than the temperature of the vaporizer. The ration of helium to the oxygen is 1:1~5.1. The plasma reaction may be performed for 0.5~1.5 minute.

Meanwhile, the base material is a sheet for making a cooling fin for a heat exchanger. In this instance, the temperature of the vaporizer 130~150 and 150 is preferable. The gas supplied to the helium is oxygen and the ration of the helium to the oxygen 5:1. The precursor may be supplied in the plasma reaction for 1.0~2.0 cc/min.

In another embodiment, a method for fabricating the product having a functional film includes a supplying step of supplying a base material to a single chamber; a pre-cleaning step of supplying cleaning gas to the chamber to clean the base material; a functional layer providing step of supplying a functional film to the base material by reacting with plasma reaction by supplying a precursor to the chamber to exhaust the precursor; and a post-cleaning step to cleaning the base material having the functional film and to exhausting the cleaning gas.

The functional film may have corrosion resistance and hydrophilicity and it may have antibiosis. The precursor is Ti—Si precursor. The cleaning gas may use the reaction gas supplied to the chamber together with the precursor.

In a still further embodiment of the invention, an apparatus for manufacturing a plasma enhanced chemical vapor deposition apparatus includes a single chamber in which plasma reaction is performed to form a functional film on a base material; a precursor tank connected with the chamber to receive a film having corrosion and hydrophilicity functional film, to receive a precursor capable of forming the corrosion resistant and hydrophilic film on the base material. The precursor may form the antibiotic functional film. The precursor may be a Ti—Si precursor.

In a still further embodiment of the invention, a plasma enhanced chemical vapor deposition apparatus comprises a chamber in which plasma reaction is performed to provide a functional film to an object received in the, a pallet mechanically and electrically connected with the object; a conveyer to convey the pallet to an outside from an inside of the chamber; and a power supplier to selectively supply an electric power to the pallet.

The apparatus may further include an electric pole provided in the chamber to be provided with an electric power having the reverse polarity with respect to the power supplier.

The power supplier provides a positive electric power (anode) power and a negative (cathode) electric power is provided to the electric pole.

The apparatus may further include an entry door provided to the chamber to selectively open and close the chamber.

The at least one conveyer may include a front part provided in front of the entry door to convey the pallet in to the chamber.

At least one conveyer may include a first elevator move the pallet vertically.

The at least one conveyer may include an internal part provided inside the chamber.

The apparatus may further include an exit door provided in the chamber in an opposite position to the entry door to selectively open and close the chamber.

The at least one conveyer may include a rear part provided behind the exit door to convey the pallet out of the chamber.

The rear part may include a second elevator move the pallet vertically.

The conveyer may include a connecting part provided outside the chamber to convey the pallet from the front part to the rear part.

The pallet may include a base; a jig to fix the object; and a fixing part to coupled to the jig above the base, to fix the object to the pallet.

The fixing parts may be provided at both sides of the pallet along a longitudinal direction of the pallet.

The fixing part may include a pallet contact selectively contacting with the moving contact.

The pallet contact may be provided in only one of the fixing parts and it may include a connecting wire to electrically connect the fixing parts to each other.

The fixing part may include a control plate having a plurality of holes formed therein to change a position at which the jig is fixed.

The fixing part may include a fixing plate disposed between the jig and the fixing plate to fix the jig.

The base and the fixing part may be insulated from each other.

A side door is formed in each of side surfaces of the chamber to selectively open and close the chamber.

The electric pole may be provided in the side door.

In a still further embodiment of the invention, a plasma enhanced chemical vapor deposition apparatus includes a chamber in which plasma reaction is performed to provide a functional film to an object received therein; a pallet mechanically and electrically connected with the object; a conveyer to convey the pallet to an inside from an outside of the chamber; and a power supplier to supply an electric power to the pallet, the power supplier comprising a moving contact distant from the pallet when the pallet is conveyed and contacting with the pallet when the pallet is stopped.

the pallet comprises a base; a plurality of fixing parts fixe the object to the pallet; an insulation member disposed between the fixing parts and the base to insulate the base from the fixing parts; a connecting wire to electrically connect the plurality of the fixing parts with each other.

The base may include an insulation member disposed between the conveyer and the base.

The apparatus include a plurality of jigs to support the object from the fixing part.

A plurality of holes may be formed in the fixing part to insertedly fix the jig to the hole.

The plurality of the holes coupled to the jig along a longitudinal and transverse direction of the fixing part are formed to differentiate a longitudinal pitch and a transverse pitch between the jigs from each other.

In a still further embodiment of the invention, a plasma enhanced chemical vapor deposition apparatus includes a chamber in which plasma reaction is performed to provide a functional film to an object received therein; a pallet mechanically and electrically connected with the object; a conveyer to convey the pallet to an inside from an outside of the chamber; and a power supplier to supply an electric power to the pallet, the power supplier comprising a moving contact distant from the pallet when the pallet is conveyed and contacting with the pallet when the pallet is stopped.

The pallet may include a pallet contact that selectively surface contacts with the moving contact; and a fixing part to fix the object thereto.

The moving contact may be elastically supported.

The apparatus may further include a switch to selectively apply an electric power to the moving contact based on elastic transformation of the moving contact.

The power supplier may include a safety switch to selectively apply an electric power to the moving contact based on a distance between the moving contact and the contact point with the pallet.

The safety switch of the power supplier may be moved to apply the electric power based on a distance of a safety plate integrally moving with the moving contact and a movement distance of the safety plate.

The safety switch may include switching part that contacts with the safety plate, the switching part formed of a ceramic material.

The power supplier may include a moving contact receiving part to receive the moving contact therein and a spring provided in the moving contact receiving part.

An end of the power supplier may include a switch member having an end extended toward an inside of the moving contact receiving part and the other end connected with a power line, to be selectively connected with the moving contact.

The power supplier may include a base; a moving contact part comprising the moving contact; and a moving generator driven to move the moving contact between the base and the moving contact part.

The power supplier may include a safety switch to perform power applying and power cut-off based on the moving of the moving contact part.

The moving contact part may include a moving contact, a moving contact receiving part, a connection member and a safety plate.

The connection member may be formed of a ceramic material to perform insulation between the moving contact receiving part and the safety plate.

The moving contact part may be integrally moving and the moving contact is relatively moving with respect to the moving contact receiving part.

The base and the moving generator may be provided in an inner wall of the chamber and the moving contact part is exposed to an inside of the chamber.

The apparatus may further include a cover to cover a top and a side of the moving contact part exposed within the chamber.

In a still further embodiment of the invention, a plasma enhanced chemical vapor deposition apparatus includes a chamber in which plasma reaction is performed to provide a functional film to an object received therein; at least one pair of electric poles facing each other in the chamber, with a negative electric voltage provided thereto; a pallet mechanically and electrically connected with the object to locate the object between the electric poles; a conveyer to convey the pallet to an inside from an outside of the chamber; and a power supplier to supply a positive electric power to the pallet, the power supplier comprising a moving contact that is distant from the pallet when the pallet is conveyed and contacting with the pallet when the pallet is stopped.

Advantageous Effects of Invention

The embodiments have following advantageous effects.

The apparatus for providing the functional film and the method for controlling the same may have following effects.

First of all, a product having a functional film such as corrosion resistance, hydrophilicity and antibiotic functions may be manufactured more simply and efficiently.

Furthermore, the apparatus according to the embodiments of the invention are mass-productive and production cost may be reduced effectively by supplying an electric power to the product stably.

Still further, the apparatus according to the embodiments of the invention may provide the pallet for a worker to load and unload the product smoothly. In other words, the user may load and unload the product by using the pallet and the pallet may be circulated by the conveyer. Accordingly, the worker needs not make efforts to convey and install the pallet and efficient working may be performed.

Still further, the apparatus according to the embodiments may supply the electric power more stably and safely by enlarging the area of the contact where the electric power is applied. As a result, the reliability of the contact may be enhanced even with vibration generated by the elastic force and the electric power may be supplied more safely.

Still further, the unnecessarily formed functional film may be prevented by reducing the area of the power supplier exposed to the inside of the chamber as much as possible. The power supplier may be protected effectively and durability may be enhanced.

Still further, the apparatus may provide the safety switch capable of performing power applying and power releasing based on the moving contact and the moving distance of the moving contact.

BRIEF DESCRIPTION OF DRAWINGS

Arrangements and embodiments may be described in detail with reference to the following drawings in which like reference numerals refer to like elements and wherein:

FIG. 1 is a perspective view of a plasma enhanced chemical vapor deposition apparatus according to an embodiment of the invention;

FIG. 2 is a block view of a plasma enhanced chemical vapor deposition apparatus shown in FIG. 1;

FIG. 3 is a flow chart illustrating a method for depositing plasma according to an embodiment of the invention;

FIG. 4 is a front view illustrating a circulation of a pallet shown in FIG. 1;

FIG. 5 is a sectional view of the pallet;

FIG. 6 is a sectional view of a fixing part provided in the pallet;

FIG. 7 is a perspective view of the pallet;

FIG. 8 is a perspective view of a fixing plate provided in the pallet;

FIG. 9 shows an electric pole;

FIG. 10 is a plane view of the electric pole;

FIG. 11 is a perspective view of a power supplier;

FIG. 12 is an exploded perspective view of the power supplier;

FIG. 13 is a graph illustrating a preferable process condition of FIG. 3;

FIG. 14a is a diagram illustrating a structure of a conventional titanium precursor and FIG. 14b is a diagram partially illustrating the result of reaction generated when a precursor used in an embodiment of the invention;

FIG. 15 is a graph of X ray photoelectron spectroscopy analysis for a surface of a functional film according to an embodiment of the invention;

FIG. 16 is a photograph of a salt spray test for the functional film according to the embodiment of the invention and a film generated by PCM;

FIG. 17a is a diagram illustrating a surface of a heat exchanger fabricated by using a conventional titanium precursor and FIG. 17b is a diagram illustrating a surface of a heat exchanger fabricated by using a precursor according to the embodiment of the invention;

FIG. 18 is a graph illustrating the result of a hydrophilicity test, using a size of a water droplet in the functional film according to the embodiment of the invention and the PCM film; and FIG. 19a is a graph illustrating a smell level at the surface of the heat exchanger fabricated by using the conventional titanium precursor and FIG. 19b is a graph illustrating a smell level at the surface of the heat exchanger fabricated by using the precursor according to the embodiment of the invention.

BEST MODE FOR CARRYING OUT THE INVENTION

Reference will now be made in detail to specific embodiments, examples of which are illustrated in the accompanying drawings. Wherever possible, same reference numbers will be used throughout the drawings to refer to the same or like parts.

As follows, a heat exchanger will be embodied as one of examples having a functional film and the embodiments of the invention are not limited thereby. The embodiments of the invention are applicable to other products.

First of all, in reference to FIG. 1, a detailed configuration of an apparatus providing a functional film according to an example embodiment of the invention will be described.

According to this embodiment of the invention, a heat exchanger 5 may be provided to a chamber 1 that provides a functional film to an object by performing a plasma reaction. In other words, an auxiliary chamber to clean the heat exchanger 5 need not be provided before and after the plasma reaction but such a function may be performed in a single chamber 1 according to the embodiment of the invention. The plasma reaction is performed on an object, for example, the heat exchanger 5 or other items, held in the chamber 1 may be supplied or provided with the functional film.

The chamber 1 may be connected with a precursor supply unit 400 to supply a precursor to the chamber 1, and with a reaction gas supply unit 300 to supply reaction gas to the chamber 1. Also, the chamber 1 may be connected with a cleaning gas supply unit 200 to enable supply to the chamber 1 a cleaning gas used for cleaning the heat exchanger 5 both before and after the plasma reaction. The chamber 1 may be connected with an exhaustion unit 100 to exhaust gases from the chamber 1 In other words, the cleaning gas remaining after the cleaning and gases remaining after the plasma reaction are exhausted to the outside of the chamber 1.

The precursor supply unit 400, the reaction gas supply unit 300, the cleaning gas supply unit 200 and the exhaustion unit 100 may be controlled by a control unit 500 as shown in FIG. 2.

According to the embodiment of the invention, the chamber 1 may be a predetermined room or space to provide a functional film to the object, such as a heat exchanger 5, for example, a product or a part to which an additional mechanical process will not be performed. As a result, a conveyer may be required to convey the object.

Specifically, the embodiment of the invention may further include a pallet 7 connected with the object mechanically and electrically. The object may be loaded on the pallet 7 stably and supportably. An electric power may be applied to the object via the pallet 7.

Meanwhile, the chamber 1 may include a front door (or an entry door) 12a provided to selectively open and close the chamber 1. The heat exchanger 5 may be placed into the chamber 1 via the front door 12a, and the functional film may be provided while the heat exchanger 5 is in the chamber 1. As a result, regions located before (or in front of) and after (or behind) the front door 12a may be referred to as a loading station (A) and an operation station (B), respectively. In this instance, the operation station (B) may be an internal room of the chamber 1.

As mentioned above, the embodiment of the invention may provide one or more functional films in quantity (or bulk) to the object. For that, a conveyer 3 may be provided to convey the heat exchanger 5 into the chamber 1. In other words, the conveyer 3 may convey the heat exchanger 5 from outside the chamber 1 (the loading station A) to inside of the chamber 1 (the operation station B).

More specifically, the heat exchanger 5 may be connected with the pallet 7 mechanically and electrically. That is, the heat exchanger 5 may be loaded on the pallet 7 stably and supportably, and the heat exchanger 5 may be connected with the pallet 7 electrically. The pallet 7 may be conveyed by the conveyer 3 directly and the object (e.g., the heat exchanger 5) may be conveyed indirectly via the pallet 7.

The conveyer 3 may include a front part 3a provided in front of the front door 12a to convey the pallet 7 to the chamber 1. Also, the conveyer 3 may include an internal part 3c to convey the pallet 7 within the chamber 1.

The internal part 3c may be configured to convey the pallet 7 to a preset position inside the chamber 1. In other words, the preset position is a position to apply the electric power to the object to provide the functional film.

The loading and unloading of the heat exchanger 5 and the providing of the functional film may be enabled by the front part 3a, the front door 12a and the internal part 3c mentioned above. The heat exchanger 5 to be provided with the functional film may be unloaded using the internal part 3c, the front door 12a and the front part 3a. In this instance, a loading station (A) and an unloading station (B) may be identical. That is, the loading and unloading of the heat exchanger 5 may be performed in the front of the front door 12a.

However, the loading station and the unloading station are overlapped in this instance, and it may be difficult to perform the work smoothly. This is because the loading after the unloading has to be performed at the same position after the functional film is formed. In other words, the unloading or the loading cannot be performed while the functional film is being formed so that the work performance time increases disadvantageously.

To solve this problem, a rear door (or an exit door) 12b may be provided in the chamber 1. Like the front door 12a, the rear door 12b may selectively open and close the chamber 1, and the heat exchanger 5 provided with the functional film may be taken out to the outside of the chamber 1 via the rear door 12b.

The conveyer 3 may include a rear part 3b provided behind the rear door 12b to convey the pallet 7 to the outside of the chamber 1. As a result, the object (e.g., the heat exchanger 7) provided with the functional film may be taken out to the outside of the chamber 1 by the internal part 3b, the rear door 12b and the rear part 3b. The rear region behind the rear door 12b may be referred to as an unloading station (C) that unloads the object.

The structure of the conveyer 3 may enable the loading of the object, the providing of the functional film and the unloading of the object in series. Accordingly, the functional films may be provided to the objects en masse.

Specifically, the conveyer 3 may include the front part 3a, the internal part 3c and the rear part 3b which are partitioned off from each other. However, those parts may be configured to convey the pallet 7 in series. In this instance, the expression of 'partitioned' may refer to 'partitioned spatially' and 'controllable independently'.

The pallet 7 may be conveyed on the conveyer 3. In this instance, the heat exchanger 5 may be loaded on the pallet 7. As a result, the loading of the heat exchanger 5, the providing of the functional film to the heat exchanger 5 and the unloading of the heat exchanger 5 may be serially performed through the use of the pallet 7 and the parts of the conveyer 3.

Meanwhile, the embodiment of the invention may provide a structure enabling the pallet 7 to circulate. In other words, the structure may enable the pallet 7 having the heat exchanger 5 loaded thereon that is in the unloading station (C) to be conveyed back to the loading station (A) again. For that, the apparatus according to the embodiment of the invention includes a circulation station (D). As a result, the conveyer 3 may convey the pallet 7 from the loading station (A), to the operation station (B), to the unloading station (C) and to the circulation station (D) to thereby circulate through the various stations in order.

As mentioned above, the apparatus according to this embodiment of the invention may have a following configuration to provide the functional film. In other words, the apparatus according to the embodiment of the invention may include the chamber 1, the precursor supply unit 400, the reaction gas supply unit 300, the cleaning gas supply unit 200, an exhaustion unit 100 and the control unit 500.

In reference to FIG. 2, each of the component parts will be described as follows, First of all, the chamber 1 will be described.

In the body 13 of the chamber 1 may be provided the electric pole 16 to generate the plasma reaction and the nozzle 14 to exhaust the precursor, the reaction gas and the cleaning gas. The heater may be provided in the chamber 1 to control the temperature inside the chamber 1. The component parts provided for the plasma reaction such as the electric pole 16, the nozzle 14 and the heater may be provided in the chamber 1.

A side door 12c may be formed in a lateral side of the chamber 1. A window 12d may be provided in the side door 12c, and an internal room of the chamber 1 may be visible via the window 12d.

The side door 12c may be provided for the worker to have access to the internal room of the chamber 1. As a result, the number of the side doors 12c may be provided corresponding to the number of the pallets 7 positioned in the chamber 1. According to this embodiment of the invention, two side doors 12c may be formed in a lateral side of the chamber 1 and two side doors 12c may be formed in an opposite lateral side of the chamber 1.

As shown in FIG. 2, a partition wall 18 may be provided in a center of the chamber 1 to partition off the chamber 1 into both (or two) parts. The plasma reaction may be performed in each of the both parts partitioned by the partition wall 18. For example, the heat exchangers 5 loaded in a left side of the pallet 7 may be exposed to the plasma reaction from a left part of the chamber 1 with respect to the partition wall 18 and the heat exchangers 5 loaded on a right side of the pallet 7 may be exposed to the plasma reaction from a right part of the chamber 1 with respect to the partition wall 18.

As a result, electric poles may be provided in both parts of the chamber with respect to the partition wall 18, respectively. In this instance, a lower part of the partition wall may be open. In other words, the pallet may be conveyed via the open part. The open part may be positioned in a center of the pallet and objects may be loaded on fixing parts formed in both sides of the pallet. Accordingly, the objects may be loaded in parallel and the plasma reaction may be performed to the objects simultaneously.

For the plasma reaction, the component parts including the electric pole 16, the nozzle 14 and the heater may be provided in each of the both parts of the chamber 1 with respect to the partition wall 18. Also, the component parts may be provided at the side door 12c facing the partition wall 18. As a result, the worker can open or access the chamber 1 via the side door 12c and he or she may approach or access the chamber 1 for repair and maintenance of the chamber 1 with ease.

Meanwhile, according to the embodiment of the invention, the pre-cleaning, the post-cleaning and the plasma reaction may be performed in the chamber 1. The precursor supply unit 400, the reaction gas supply unit 300, and the cleaning gas supply unit 200 have to be connected with the chamber 1. Of course, the exhaustion unit 100 to exhaust remnants after the cleanings and the plasma reaction to the outside of the chamber 1 may be connected with the chamber 1.

The precursor supply unit 400 will be described as follows.

According to a conventional technology, different chambers may be provided for corrosion resistance, hydrophilicity and antibiotic functions, respectively. A precursor is provided in each of the chambers. However, according to this embodiment of the invention, a single precursor for the corrosion resistance, hydrophilicity and antibiotic functions, which will be described later in detail, may be used, and a film having the corrosion resistance, the hydrophilicity and the antibiotic functions may be formed in the single chamber 1 at one time. As a result, a single precursor supply unit 400 may be provided.

A supply pipe 402 may connect a container 410 containing a liquid precursor and the chamber 1 with each other. A flowing control part 420 to control the flowing of the liquid precursor and a vaporizer 430 to vaporize the liquid precursor may be provided at a predetermined position of the supply pipe 402. To flow the liquid precursor efficiently, a carrier gas tank 600 may be connected with a predetermined position of the supply pipe 402. Also, a heat generating part 432, such as a heating wire, may be provided in the supply pipe 402 provided between the vaporizer 430 and the chamber 1, to maintain the vaporized status of the precursor.

The precursor may be a precursor (hereinafter, a multi-functional precursor) capable of forming a film having the corrosion resistance, the hydrophilicity and the antibiotic functions. The carrier gas may be helium and/or argon, and since the carrier gas may be identical to the carrier gas according to the conventional technology, a detailed description thereof will be omitted accordingly.

The reaction gas supply unit 300 will be described as follows.

A supply pipe 302 may be provided between a container 310 containing a reaction gas and the chamber 1. A flow controlling part 320 to control the flow of the reaction gas may be provided at a predetermined position of the supply pipe 302. The reaction gas may be air, oxygen and/or helium.

The cleaning gas supply unit 200 will be described as follows.

A supply pipe 202 may be provided between a container 210 containing a cleaning gas and the chamber 1. A flow controlling part 220 may be provided in a predetermined position of the supply pipe 202 to control the flow of the cleaning gas. The cleaning gas may be air. Those configurations may be similar to those of the conventional technology so that detailed descriptions thereof will be omitted accordingly. If air is used as the reaction gas, the cleaning gas supply unit 200 may be not provided, and the reaction gas supply unit 300 may be substituted for the cleaning gas supply unit 200.

The exhaustion unit 100 to exhaust the gases remaining in the chamber 1 to the outside the chamber 1 will be described as follows.

An exhaustion pipe 102 may be provided between a pump 110 used to exhaust the gases remaining in the chamber 1 to the outside and the chamber 1. A filter 120 may be provided at a predetermined position of the exhaustion pipe 102 to filter the gases exhausted to the outside. The pump 110 may exhaust the gases from the inside of the chamber 1 to the outside, and it may be a vacuum pump to exhaust the gases to the outside of the chamber 1 and to make the inside of the chamber 1 be a vacuum state.

The control unit 500 will be described as follows.

The control unit 500 may control the chamber 1, the precursor supply unit 400, the reaction gas supply unit 300, the cleaning gas supply unit 200 and the exhaustion unit 100. Also, the control unit 500 may control the conveyers 3*a,* 3*c* and 3*b* that convey the pallet 7 having the heat exchangers 5 loaded thereon.

In reference to FIGS. 2 and 3, a method for controlling an apparatus for providing a functional film according to an embodiment of the invention will be described as follows.

First of all, an object (the heat exchanger 5 according to this embodiment of the invention) may be supplied to the chamber 1 (a supplying operation, S1). Given the heat exchanger 5 in the chamber 1, the cleaning gas may be supplied to the chamber 1 to clean the heat exchanger 5 (pre-cleaning operation, S3). In this instance, when the heat exchanger is clean already, this operation may be omitted or skipped.

After the heat exchanger 5 is cleaned, the precursor may be supplied to the chamber 1 to generate a plasma reaction and the functional film may be provided to the heat exchanger 5 (functional film providing operation, S5). After the functional film is formed, the cleaning gas may be supplied to the chamber 1, and the heat exchanger 5 having the functional film formed therein may be re-cleaned (post-cleaning operation, S7). Lastly, the heat exchanger 5 having the functional film formed therein may be unloaded to the outside of the chamber 1 (unloading operation, S9).

Each of the operations will be described in detail as follows.

The supplying operation (S1) to supply or load the heat exchanger 5 to the chamber 1 will be described. The heat exchanger 5 may be loaded on the pallet 7, and the pallet 7 having the heat exchanger 5 loaded thereon may be conveyed by the front part 3*a* of the conveyer 3 to the chamber 1. In other words, the front door 12*a* may be opened and the front part 3*a* and the internal part 3*c* of the conveyer 3 may be driven. After that, the heat exchanger 5 may be conveyed into the chamber 1. Once the introduction of the heat exchanger 5 into the chamber is complete, the front door 12*a* may be closed.

Meanwhile, the parts of the conveyers 3*a,* 3*c* and 3*b* may be controlled independently or in communication with each other. When they are controlled in communication with each other, the introduction and exhaustion of the different heat exchangers 5 may be performed simultaneously.

The pre-cleaning operation (S3) to clean the heat exchanger 5 before forming of the functional film will be described. The cleaning gas supply unit 200 may supply the cleaning gas to the chamber 1, and the heat exchanger 5 may be cleaned by the cleaning gas. Once cleaning of the base material is complete, the gas remaining inside the chamber 1 may be exhausted by the pump 110 provided in the exhaustion unit 100. During the process, the gas may be exhausted until the internal room of the chamber reaches 1 an initial vacuum level.

The functional film providing operation (S5) to form or provide the functional film on the heat exchanger 5 will be described. First of all, the gases remaining in the chamber 1 may be substantially exhausted to the outside of the chamber 1 by using the exhaustion unit 100, especially, by operating the pump 110, to make a vacuum level of the chamber 1 reach a workable vacuum level. Also, the chamber 1 may be controlled to have a temperature by using a heater provided in the chamber 1 to make the chamber 1 satisfy a preset temperature condition.

The electric power may be provided for supply to the heat exchanger 5, specifically, the pallet 7, which will be described later.

Once the internal condition of the chamber 1 is fitted to the plasma reaction, that is, once the vacuum level inside the chamber 1 reaches the workable vacuum level, the flow controlling part 320 of the reaction gas supply unit 300 may be controlled and the reaction gas may be supplied to the chamber 1. Also, the precursor may be supplied to the chamber 1 by controlling the flow controlling part 420 of the precursor supply unit 400.

The quantity and supply time of the reaction gas, the quantity and supply time of the precursor, and the plasma reaction time may be controlled to be optimal or workable.

The post-cleaning operation to clean the heat exchanger 5 having the functional film formed thereon will be described. The cleaning gas may be supplied to the chamber 1 by the cleaning gas supply unit 200, and the heat exchanger 5 having the functional film formed thereon may be cleaned by the cleaning gas. Once the cleaning is complete, the gas may be exhausted to the outside of the chamber 1 by operating the pump 110 of the exhaustion unit 100.

Meanwhile, the post-cleaning operation may be performed right after the completion of the plasma reaction. In other words, the cleaning gas may be supplied after the plasma reaction completion and it may be possible to exhaust the reaction remnants and clean the heat exchanger 5 simultaneously.

The plasma reaction may be performed by supplying the electric power to the heat exchanger 5. As a result, when the plasma reaction is complete, an operation performed to supply the electric power to the heat exchanger will be cleared. Such the power supply clearing operation may be performed after the completion of the plasma reaction. Alternatively, the power supply clearing operation may be performed after the post-cleaning operation.

Once the post-cleaning operation is completed, a vent operation to relieve a pressure difference between an inner space and an external space with respect to the chamber may be performed.

The unloading operation to unload the heat exchanger 5 having the functional film formed thereon from the chamber 1 will be described. The heat exchanger 5 having the functional film and loaded on the pallet 7 may be conveyed outside the chamber 1 by the parts 3*a,* 3*c* and 3*b* of the conveyer 3. As a result, introduction and exhaustion of the heat exchanger 5 may be performed simultaneously. Also, during the plasma reaction, the loading and unloading of the heat exchangers 5 may be performed simultaneously. Accordingly, forming of the functional film en masse through use of a series of operations is possible.

In reference to FIG. 13, a preferable process condition will be described as follows. Although the embodiments of the invention are not limited thereto, the process condition which will be described as follows is proper to a multifunctional precursor which will be described later.

The gas supplied to the chamber 1 may be helium, oxygen, air or appropriate combination of them. In FIG. 13*c*, helium and oxygen are used. As shown in FIG. 13*c*, the ratio of helium to oxygen may be 1:1~5:1 and it preferable that the ratio is 3:1.

The precursor supplied to the chamber 1 is gaseous after evaporated by the vaporizer 430 and the gaseous state is maintained by the heat generating part 432 provided in the supply pipe 402 located between the vaporizer 430 and the chamber 1. FIG. 13d is a graph illustrating an adhesion force according to the temperature of the vaporizer of the precursor. As shown in FIG. 13d, when using the multifunctional precursor which will be described later, the temperature of the vaporizer to vaporize liquid precursor may be 150~210 degrees and 190 degrees may be preferable. The temperature of the heat generating par 432 may be relatively lower than the temperature of the vaporizer 430. For example, when the temperature of the vaporizer is 190 degrees, the temperature of the heat generating part 432 may be 150 degrees.

In a state of the reaction gas and the precursor supplied to the chamber 1, an electric power is applied to the electric pole 16 to generate plasma reaction. The FIGS. 13a and 13b are graphs illustrating an adhesion force according to currents applied to the chamber and the current applying time. As shown in FIGS. 13a and 13b, the plasma reaction time may be 0.5~1.5 minute at 1.2~1.8 A. It is preferable that the plasma reaction is performed for 1.5 minute at 1.8 A.

According to the embodiment mentioned above, the functional film may be formed in the heat exchanger 5 by the control unit's controlling the precursor supply unit 400, the reaction gas supply unit 300, the cleaning gas supplying unit 200 and the exhaustion unit 100 which are connected with a single chamber 1. By extension, the multifunctional precursor capable of simultaneously having corrosion resistance, hydrophilicity and antibiosis is used, such that the corrosion resistant, hydrophilic and antibiotic film may be formed in the single chamber 1 at once.

Such the multifunctional precursor, in other words, the precursor having corrosion resistance, hydrophilicity and antibiosis function will be described as follows. The multifunctional precursor according to this embodiment includes titanium hydroxide (Ti(OH)$_4$) and silicon hydroxide (Si(OH)$_4$) (hereinafter, the precursor having the titanium and silicon particles is referenced to as "titanium-silicon precursor (namely, Ti—Si precursor)). The Ti—Si precursor according to the embodiment of the invention is used for plasma-coating the surface of the heat exchanger and the multifunctional film having corrosion resistance, hydrophilicity and antibiosis can be gained (detailed description of the multifunctional film will be described later). Meanwhile, the Ti—Si precursor may be fabricated according to a different method and it may be fabricated by using a conventionally used Ti precursor, namely, titanium isopropoxide (Ti(OC$_3$H$_7$)$_4$) (hereinafter, "TTIP")(the structure of TTIP is shown in FIG. 14a).

The fabricating process of the Ti—Si precursor according to this embodiment will be described as follows. The precursor according to this embodiment is made by reaction of titanium isopropoxide, silicon and carboxylic acid. Carboxylic acid may be acetic acid (CH$_3$COOH). Chemical reaction thereof will be as follows. TTIP (Ti(Or')$_4$), Si and RCOOH react together. In this instance, R' and R are in an alkyl group. R' is C$_3$H$_7$ and R is C$_n$H$_{2n+1}$. As the result of reaction, Ti(OH)$_4$, Si(OH)$_4$, Si(OH)$_4$ and RCOOR' may be generated.

In other words, titanium isopropoxide reacts with silicon and carboxylic acid, to generate titanium hydroxide (Ti(OH)$_4$), silicon hydroxide (Si(OH)$_4$) and RCOOR'. When a catalyst is used, with the reaction temperature of 40~50 degrees although it is differentiated by the reaction condition, 30~40% of the titanium isopropoxide remains in a non-reaction state. RCOOR' is a kind of ester and this reaction may be a kind of eterification reaction. However, ester generally smells good. Accordingly, a material before the eterification reaction, that is, carboxylic acid may be determined to allow the ester generated as the result of the esterification reaction to have aromaticness and a good coating ability with respect to metal. Meanwhile, based on the result of the reaction, a predetermined material having the structure shown in FIG. 14b may be generated. In other words, a hydrogen component of the titanium hydroxide structure is substituted for silicon or R' or a hydrogen component of the silicon hydroxide structure is substituted for titanium or R'.

Meanwhile, the titanium hydroxide and silicon hydroxide generated as the result of the reaction may be substantially involved in the plasma reaction and the Ti—Si film is formed on the surface of the heat exchanger, to have corrosion resistance, hydrophilicity and antibiosis function. It is possible to use only the titanium hydroxide and the silicon hydroxide as the precursor. However, it is cumbersome and high-cost to separate only them from the result materials of the reaction 1. It is preferable that the results of the reaction 1, specifically, titanium hydroxide, silicon hydroxide, ester, remaining titanium isopropoxide and the other materials are used as precursors as they are. The remaining titanium isopropoxide and the other materials can be acted as the titanium precursors and the ester can be exhausted without deeply involved in the plasma reaction. In this instance, it is preferable that the amount of the remaining titanium isopropoxide is reduced. Accordingly, the titanium isopropoxide may react secondarily to reduce the amount of the titanium isopropoxide as much as possible. For example, silicon and carboxylic acid react with the results of the reaction 1 again.

RCOOR' reacts with the results of the reaction 1 again, in other words, Ti(OH)$_4$, Si(OH)$_4$, RCOOR' and non-reaction TTIP and the other materials which are mixed with each other. If then, the results of the reaction may be also Ti(OH)$_4$, Si(OH)$_4$ and RCOOR'. When a catalyst is used in this reaction, with the reaction temperature of approximately 30~50 degrees, less than approximately 10% of non-titanium isopropoxide remains. In other words, two reactions may react approximately 90% of TTIP.

The chemical reactions mentioned above will be described as follows.

A basic chemical reaction is Ti(OR)$_4$+4RCOOH–>Ti(OH)$_4$+RCOOR'. That is, R' of TTIP is substituted for H of carboxylic acid. However, when Si reacts in this chemical reaction, Si is substituted for Ti. This is because reactivity of Ti is similar to reactivity of Si. Accordingly, substitution reaction is partially generated in the reaction result of Ti(OH)$_4$, to substitute some part of Si(CO$_3$H$_7$)$_4$ for Si(OC$_3$H$_7$)4 and Si(OC$_3$H$_7$)$_4$ reacts with carboxylic acid to form Si(OH)$_4$.

Meanwhile, Si reacts as it is in the chemical reaction mentioned above and this embodiment is not limited thereto. In other words, a Si-based compound may be used instead of Si. For example, Si(OR)$_4$-type silicon alkoxide may be used. That is, Si(OCH$_3$)$_4$ tetramethyl orthosilicate, Si(OC$_2$H$_5$)$_4$ tetraethyl orthosilicate, Si(OC$_3$H$_7$)$_4$ tetrampropyl orthosilicate may be used.

When using the conventional Ti-precursor, a titanium oxide (TiO$_2$) thin film is formed on the surface of the heat exchanger and a carboxyl group (COOH), oxygen, carbon and nitrogen are combined with the TiO$_2$ thin film. However, according to this embodiment, as shown in FIG. 15, Titanium-hydroxide compound and silicon-hydroxide compound are coated on the surface of the heat exchanger. For example, the TiO$_2$ and SiO$_2$ thin film may be formed on the surface of the heat exchanger. Based on the result of observation, the titanium hydroxide is a thin film type and the silicon hydroxide is a particle type. According to this embodiment, carboxyl group combination is separated to be combined with the thin film as a hydroxyl group, an oxygen-radical (—$O_2$).

As mentioned above, when using the conventional Ti-precursor, the titanium hydroxide is mainly acted as a backbone. However, in this embodiment, the titanium and silicon are combined with the surface of the heat exchanger firmly to be employed as the backbone. Accordingly, corrosion resistance may be enhanced and the adhesion force is 0.8 kgf or more. To experiment the corrosion resistance, a salt spray test is performed. The result of the salt spray test shows that corrosion is generated in 2 and 40 samples as 15 and 30 days passes after spraying salt, when using the conventional TTIP precursor. The result shows that corrosion is generated in 0 and 20 samples, when using the precursor according to this embodiment. FIG. 16 is photographs of samples before the salt spray and in 200 hours after the salt spray.

Meanwhile, as shown in FIG. 17, when using the conventional Ti-precursor, a surface tension is 67 mN/m and a contact angle is approximately 10~20. When using the precursor according to this embodiment, a surface tension is 70~72 mN/m and a contact angle may be 0 degree. Also, as shown in FIG. 18, the droplet size id 9~12 mm. In other words, hydrophilicity is remarkably enhanced. In the embodiment, the hydroxyl group and oxygen-radical combined with the surface of the heat exchanger may be relatively increased and they may enhance hydrophilicity. Also, the silicon hydroxide may be porous particles that water can soak, only to enhance hydrophilicity even more.

Meanwhile, according to the embodiment, the surface of the heat exchanger may have antibiosis. This is because the silicon hydroxide has the porous structure. The silicon hydroxide has a nanometer-sized pore and a non-surface area may be increased. In other words, a fungus or bacteria might be absorbed to the pore of the silicon hydroxide. The nanometer-sized pore may interfere with nutrition supply to the absorbed bacteria and a cell membrane of the bacteria might be broken.

Meanwhile, when using the conventional Ti-precursor, in other words, titanium isopropoxide, there is a problem of bad smell from the heat exchanger. This is because of the alkyl group ($C_3H_7$) provided in the titanium isopropoxide. In other words, the non-reaction titanium isopropoxide in the plasma reaction chamber might be attached to the surface of the heat exchanger and it will not be eliminated completely even cleaned by water or air, only to generate bad smell. However, according to this embodiment, only the small amount of titanium isopropoxide is supplied to the chamber and it might hardly be attached to the surface of the heat exchanger. Accordingly, little bad smell is generated. As shown in FIG. 19, in the conventional Ti-precursor, a smell level is 3.9 and in the precursor according to this embodiment, a smell level is 0.9. That is, compared with the conventional precursor, the precursor according to this embodiment may reduce 80~90% of the bad smell. 100% of the TTIP is supplied to the chamber in the conventional TTIP precursor. Only approximately less than 10% TTIP remains after performing two reactions in this embodiment. As mentioned above, according to this embodiment, the functional film having corrosion resistance, hydrophilicity and antibiosis may be formed in the single chamber in the single process by using the Ti—Si precursor. Also, according to this embodiment, the bad smell generated in the coated heat exchanger may be reduced noticeably.

In the embodiment mentioned above, it is described that the single Ti—Si precursor is used to form the functional film having corrosion resistance, hydrophilicity and antibiosis in the heat exchanger. However, the embodiments of the invention may not be limited thereto. For example, the embodiment may be applicable to a precursor for corrosion resistance, a precursor for hydrophilicity and a precursor for antibiosis that are used independently. In this instance, a corrosion resistance precursor supply unit, a hydrophilicity precursor supply unit and an antibiosis precursor supply unit may be connected to a single chamber. The type of the precursor supplied to the chamber may be sequentially controlled by the control unit.

In reference to FIG. 4, the circulation of the pallet 7 with respect to the conveyer 3 will be described in detail as follows.

In an embodiment of the invention as mentioned above, two heat exchangers 5 may be loaded on a single pallet 7 at both sides thereof. The chamber 1 may hold two pallets 7 along a longitudinal direction. In this instance, a single plasma working may provide functional films to the heat exchangers 5 loaded on the two pallets 7, that is, four heat exchangers 5, respectively. The chamber 1 may be configured to hold two or more pallets 7. Also, two or more objects (e.g., the heat exchangers 5) may be loaded on a single pallet 7.

For increased work efficiency, a first set of two pallets 7 may be located in the loading station (A) along a longitudinal direction of the pallets 7, and a second set to two pallets 7 may be located even in the unloading station (B) along the longitudinal direction. In this instance, additional third set of two pallets 7 may be located in the chamber 1. Thus, such pallets 7 may be positioned on the front part 3a, the internal part 3c and the rear part 3b.

For the circulation of the pallets 7, the conveyer 3 may include a connecting part 3d to convey the pallet 7 from the rear part 3c to the front part 3a. The connecting part 3d may be provided outside the chamber 1. Especially, the connecting part 3d may be provided below the chamber 1.

More specifically, the connecting part 3d may be positioned under the other parts of the conveyer 3 in parallel.

The front part 3a and the rear part 3b may include elevators 4a and 4b, respectively, to change perpendicular positions of the pallet 7.

First of all, once the unloading of the heat exchanger 5 is completed in the unloading station (C), the pallet 7 may be conveyed downwardly by the operation of the elevator 4b. After that, the pallet 7 may be conveyed to the loading station (A) by the connecting part 3d from the circulation station (D). In this instance, the pallet 7 may be positioned downside and it may be elevated by the operation of the elevator 4a. The elevators 41 and 4b may be configured to elevate the pallet 7. Accordingly, the pallet may be circulated by each of the component parts provided in the conveyer 3.

In this instance, the loading and the unloading may be performed by a worker. The perpendicular positions of the loading and the unloading may be very important for work efficiency. The perpendicular positions in this instance may be different from perpendicular positions of the pallet 7 inside the chamber 1.

As a result, the elevators 4a and 4b may be adjusted to have a plurality of preset heights. In other words, the perpendicular height may be adjusted for a conveying position and a circulating position. Also, it may be adjusted for a loading position and an unloading position. The loading and unloading positions may be located between the conveying position and the circulating position, and be higher than the conveying position.

Meanwhile, it might take a much time to convey the pallet 7 to circulate to the loading station (A) from the unloading station (C). Accordingly, the pallet 7 may be provided in the circulating station (D). In other words, once forming of the functional film is complete, the pallet 7 positioned in the circulating station (D) may be conveyed to the loading station (A) and the pallet 7 positioned in the unloading station (C) may be conveyed to the circulating station (D). As a result, it may be possible to reduce the time taken to circulate the pallets 7 remarkably.

Flow of processes relating to the circulation of the pallets 7 will be described.

The loading in the loading station (A), the functional film being provided in the operating station (B) and the unloading in the unloading station (C) may be performed simultaneously. The pallet 7 having no heat exchangers 5 loaded thereon may be waiting in the circulating station (D). When the work is completed, each of the pallets 7 positioned in each of the stations may be conveyed to the next station sequentially. As a result, serial work may be performed and the work process time may be reduced noticeably.

The pallet 7 according to an embodiment of the invention will be described in detail in reference to FIGS. 5 and 8 as follows.

FIG. 5 is a sectional view illustrating the pallet 7 positioned on the conveyer 3 according to an embodiment of the invention.

The pallet 7 may include a base 7a. The base 7a may be positioned at an upper area of the conveyer 3 to be directly conveyed by the conveyer 3. The connection between the conveyer 3 and the base 7a may enable transfer of the pallet 7 stably without the pallet 7 rolling horizontally. Meanwhile, an electric power may be directly applied to the pallet 7, and not via the conveyer 3, which will be described in detail later. Accordingly, the electric power may be applied to the pallet 7 stably.

In this instance, the electric power has to be prevented from being applied to the conveyer 3 via the pallet 7. If the electric power is applied to the conveyer 3, unnecessary functional films might be formed on the conveyer 3. To prevent that, an insulation material 7f may be provided between the conveyer 3 and the base 7a of the pallet 7. The insulation material may be coupled to a back surface of the base 7a.

Meanwhile, the pallet 7 may include a jig 7b to load the heat exchanger 5 thereon. In other words, the jig 7b may be provided to fix the object. The plurality of the jigs 7b may be provided, to fix the heat exchanger 5 more stably.

The plurality of the jigs 7b may be provided along a longitudinal direction of the pallet to support the object more stably and to form an electrical contact, or they may be provided along a transverse direction of the pallet. As a result, a plurality of supporting points and electrical contacts may be formed for a single product. This can result in stable supporting of the product and uniform power supply to the product, such that a uniform functional film may be formed on the entire region of the product.

The pallet 7 may include a fixing part 7c coupled to the jig 7b from a top side of the base 7a, to fix the heat exchanger 5 to the pallet 7.

A plurality of fixing parts 7c may be formed. The fixing parts 7c may be formed in both sides of the pallet 7 along a longitudinal direction of the pallet 7, respectively. As a result, two heat exchangers 5 may be loaded on a single pallet 7. The plurality of the heat exchangers may be loaded along a longitudinal direction of the single fixing part. The fixing part 7c may include a pallet contact 7d. In other words, the electric power may be applied to the pallet 7 via the pallet contact 7d.

The pallet contact 7d may be provided to one of the fixing parts 7c. This is because a position to supply the electric power to a single pallet may be one. Accordingly, one of the fixing parts 7c may be electrically connected with the other one of the fixing parts 7c via a connecting wire 7e. In other words, the fixing part 7c and the base 7a may not be electrically connected with each other. This is because an unnecessary functional film should not be formed on the pallet 7. As a result, the fixing part 7c and the base 7a may be insulated from each other and the insulating material 7g may be disposed between them. The insulating material 7g may be disposed between the pallet contact 7d and the base 7a to insulate them from each other.

Accordingly, the electric power may be provided only to the fixing part and a connecting wire may be connected to the fixing parts to electrically connect them with each other.

Meanwhile, a plurality of the pallet contacts 7d may be formed in one of the fixing parts 7c along a longitudinal direction of the fixing parts 7c. In this instance, the electric power may be supplied to only one of the pallet contacts 7d. This is because the plurality of the pallets 7 should not be introduced into the chamber along the longitudinal direction. In other words, the position to supply the electric power to a front one of the pallets 7 may be different from the position to supply the electric power to the next one of the pallets 7 that is located behind the front one.

For example, a pallet contact 7d in front of the pallet 7 may be a contact used when the pallet 7 is positioned in the front and a pallet contact 7d behind the pallet 7 may be a contact used when the pallet is positioned in the back.

In this instance, a moving contact of the power supplier may selectively contact with the pallet contact, when the pallet is standing in the chamber after moving. As a result, the electric power is supplied to the pallet when the pallet is standing and more stable and constant electric power supply may be enabled.

In reference to FIG. 6, the structure of the fixing part 7c provided in the pallet 7 will be described in detail.

The fixing part 7c may include an adjusting plate 70 having a plurality of holes 71 formed therein to be connected with the jig 7b. If the plurality of the jigs 7b are coupled to the fixing part 7c, pitches between them may be adjusted.

The pitches may include pitches along a longitudinal direction and pitches along a transverse direction of the pallet 7. Accordingly, longitudinal distances and transverse distances may be adjusted between the jigs, and stable supporting of various products may be enabled.

Also, the fixing part 7c may include a fixing plate 72 disposed between the jig 7b and the adjusting plate 70 to fix the jig 7b.

As shown in FIG. 6, the jig 7b may include a body 75 and a supporting part 76. A recess 78 may be formed in the body 75 to fixedly insert a predetermined area of the heat exchanger 5 therein. For example, a refrigerant tube provided in a lateral side of the heat exchanger 5 may be fixedly fitted to the recess 78. As a result, the shape (and/or the size) of the recess 78 may be variable according to a shape (and/or the size) of an object fitted thereto. The In this instance, the shape (and/or the size) of the recess 78 formed in the jig 7b may be variable according to the type of the heat exchanger 5. For example, the recess 78 may be formed in "U" shape. The jig 7d may be a configuration to support the heat exchanger and to transfer the electric power applied from the pallet contact 7d to the heat exchanger.

The supporting of the heat exchanger enabled by the recess 78 has following effects. That is, the shape of the recess may be the shape of the refrigerant tube such that the jig and the refrigerant tube may be in surface-contact within the recess. Accordingly, the electrical contacts may form a surface to enable the electric power to be supplied stably and uniformly.

Here, the area formed by the electrical contacts is very important. If the electric power is supplied only to a specific point intensively, there might be a spark. Such a spark might interfere with stable plasma reaction and it might be difficult to form the uniform functional film.

As a result, the supporting of the product enabled by the recess 78 of the jig is quite efficient and preferable.

The supporting part 76 of the jig 7b may be rod-shaped and a slot 77 with a small radius may be formed in the supporting part 76.

In reference to FIGS. 7 and 8, the coupling among the jig 7b, the adjusting plate 70 and the fixing plate 72 will be described.

The plurality of the holes 71 may be formed in the adjusting plate 70 as mentioned above. The plurality of the holes 71 may be formed in a preset pattern. For example, two holes 71 may be formed along a longitudinal direction of one of the fixing parts 7c and a single hole may be formed. Such a pattern may be repeated. As a result, the width of the jigs 7b may be adjusted by such that the plurality of the holes 71 and the plurality of the heat exchangers 5 may be loaded on a single fixing part 7c. In this instance, the various heat exchangers 5 may be supported stably. This is because the pitches between the jigs along the longitudinal direction and the pitches along the transverse direction can be adjusted by the pattern of the holes.

The supporting part 76 of the jig 7b may be supported by being inserted in a specific hole of the adjusting plate 70. In this instance, the fixing plate 72 may fix the jig 7b to the adjusting plate 70 stably.

Specifically, as shown in FIG. 8, a plurality of slots 73 may be formed in the fixing plate 72, corresponding to the holes 71 of the adjusting plate 70. The width of the slot 73 may be smaller than the diameter of the hole 71 formed in the fixing plate 72. The width of the slot 73 may correspond to the width of the slot 77 formed in the supporting part 76. Also, the slot 73 may be open toward a preset direction.

As a result, the fixing plate 72 may slide on the adjusting plate 70, when the jig 7b is inserted to the hole 71 of the adjusting plate 70.

In other words, the fixing plate 72 may slide, with the slot of the supporting part 77 inserted in the slot 73 of the fixing plate 72. After that, the fixing plate 72 may be fixed to the adjusting plate 70 and the jig 7b may be couples to the adjusting plate 70 stably. To fix the fixing plate 72 to the adjusting plate 70, a coupling hole 74 may be formed in the fixing plate 72.

Such a structure may enable the fixing and the adjusting of the jig 7b. As a result, the structure may deal with the various sizes and types of the heat exchangers 5 efficiently and easily.

An electric pole will be described in detail in reference to FIG. 9 as follows.

An electric pole 16 may include at least a couple of electric surfaces facing each other. In other words, the electric surfaces may be formed at both sides of the object.

The electric surfaces 160 may be provided in the partition wall 18 or the side door 12c. Such an electric surface 160 shown in FIG. 9 may include a net-shaped (or mesh-shaped) plasma reacting surface 161 and an electric pole holder 162 supporting the plasma reacting surface 161 at each of both sides of the plasma reacting surface 161.

Also, a holder coupler 163 may be provided in an inner wall of the chamber 1 to support the electric pole holder 162. The inner wall of the chamber 1 may be an inner wall of the side door 12c or an inner wall of a partition wall 18.

When the plasma reaction is repeatedly performed, the plasma reacting surface 161 might be increased (or be elongated) to droop disadvantageously and the plasma reaction might not be performed uniformly. To solve the problem, a tensile force may be applied to the plasma reacting surface 161.

For that, the holder coupler 163 may be elastically supported to generate an elastic force in an outward direction of the holder coupler 163. In other words, a spring 164 may be provided behind the holder coupler 163. When the electric pole holder 162 is coupled to the holder coupler 163 for the first time, the holder coupler 163 may be in a state similar to a spring being tensioned. When the plasma reacting surface 161 is loose, the tensile force may be applied to the plasma reacting surface 161 by a restitution (or recovery) of the spring.

Meanwhile, the electric surface 160 may include a multi-stair (or a multi-step). As a result, the electric surface 160 having the plasma reaction performed thereon may be selectively controlled based on the height of the object.

As shown in FIG. 9, a nozzle 14 may be positioned between the electric surfaces 160. A reaction gas, a precursor and a carrier gas may be supplied via a nozzle 14.

In this instance, the nozzle 14 may be formed in a circular tube 140. In other words, the gases flowing along the circular tube 140 may be supplied to the object via the nozzle 14 formed in a front side of the circular tube 140.

Meanwhile, the plurality of the circular tubes may be provided. The plurality of the circular tubes may be provided along the electric pole longitudinally or perpendicularly. The precursor and the other parts may be substantially provided into the chamber by the circular tubes provided longitudinally.

In this instance, the circular tubes may be in communication with each other via both side fittings 149 to be replaced when they are damaged. The circular tubes may have the same length. Accordingly, auxiliary circular tubes having various lengths need not be prepared. A heater may be buried in the circular tube via cover, which will be described later, such that the circular tubes may enable the electric power to be supplied to the heater.

The position of the circular tube 140 may be in front of the electric surface 160. In other words, the circular tube may be closer to the object. Accordingly, the nozzle 14 may be prevented from being clogged noticeably.

The plasma reaction may be performed by the reaction gas, the precursor and the carrier gases supplied via the nozzle. There might be difference between the supply of the precursor from the position where the reaction is performed and the supply of the precursor to the position where the reaction is performed.

When the precursor is supplied from the position where the reaction is performed, most of the supplied precursors can be used in the plasma reaction and a pressure difference between a nozzle inside and a nozzle outside may be maintained constantly. Accordingly, the precursors may be supplied via the nozzle constantly. However, when the precursor is supplied from the position where the reaction is not performed to the position where the reaction is performed, a predetermined amount of the supplied precursors cannot be used in the plasma reaction. Accordingly, the pressure of the nozzle outside might be high and nozzle clogging might be generated. As a result, the position of the circular tube, that is, the position of the nozzle may be located in front of the electric surface 160. In other words, the nozzle may be closer to the plasma object than the electric surface.

A heater 402 may be provided in the circular tube 140 to heat the gases and the like so as to enable the gas and the like to flow smoothly therein. However, the heater 402 might be easily damaged by the plasma reaction. Thus, it may not be preferable that the circular tube 140 is integrally formed with the heater 402.

Accordingly, to ease installation and repair, the heater 402 may be buried in a rear surface of the circular tube and a cover 143 may be provided, before fixing a wire (or a heating wire) 142.

In this instance, the plurality of the circular tubes 140 may be provided, with the nozzle 14 formed therein. Such the circular tubes may be in communication with each other via both side fittings 149. Accordingly, if damage is generated in one of the circular tubes, for example, nozzle clogging or heater damage, only the damaged circular tube may be replaced.

In reference to FIGS. 11 and 12, a power supplier 80 to supply an electric power to the pallet will be described in detail as follows.

The electric pole 16 mentioned above may be provided in the chamber 1. In other words, the electric poles 16 may face the partition wall 18 and the side door 12*c* within the chamber 1, respectively. The heat exchanger 5 may be positioned between the electric poles 16.

For the plasma reaction, a pole of the electric pole 16 may be opposite to a pole of the heat exchanger 5. According to the embodiment of the invention, a positive pole (anode) may be the pole of the heat exchanger 5 and a negative pole (cathode) may be the pole of the electric pole 16.

To supply the electric power to the heat exchanger 5, more specifically, to the pallet 7, a power supplier 80 may include a moving contact 81. In detail, the moving contact 81 may be distant from the pallet 7 while the pallet 7 is conveyed. The moving contact 81 may be closer to the pallet 7 to make contact with the pallet 7 for the plasma reaction. An air cylinder 86 may be provided to realize such the moving contact 81. Accordingly, the moving contact 81 may be moved forwardly and backwardly by the operation of the air cylinder 86 basically.

In other words, the moving contact 81 may selectively be in contact with the contact 7*d* of the pallet 7. The moving contact 81 and the contact 7*d* of the pallet 7 may include plane surfaces, respectively. The plane surfaces may make surface-contact with each other, to supply the electric power more stably.

Also, the moving contact 81 may be elastically supported. That is, when the moving contact 81 is in contact with the pallet 7 after a movement, the moving contact 81 may move further for a predetermined distance. The distance may be a distance that enables the contact to be compensated reliably by the elastic support. As a result, even if a vibration is generated, the elastic support may perform the stable supply of the electric power.

Meanwhile, the power supplier 80 may include a switch 82' or a switch member. The switch 82' selectively supplies the electric power to the moving contact 81 based on elastic deformation of the moving contact 81.

Specifically, the power supplier 80 may include a contact receiving part 82 to receive the moving contact 81. The moving contact 81 may be elastically supported by an elastic member 81' within the contact receiving part 82. The elastic member may be a spring provided in the contact receiving part 82. Accordingly, the contact receiving part 82 may move forwardly even when the moving contact contacts with the pallet contact. In this instance, the moving contact 81 may not move forwardly and the elastic member provided between the moving contact and the contact receiving part may be elastically transformed.

The switch member 82' may be a shaft. An end of the switch member may be selectively and electrically connected with the moving contact and the other end of the switch member may be connected with a power line (not shown).

In this instance, the switch member may be electrically connected with the moving contact, when the moving contact 81 is advancing by the elastic force. Accordingly, the electric power may be supplied more stably.

A safety plate 85 may be provided behind the contact receiving part 82. Also, a plurality of connecting members 84 may be provided to determine the forward and backward moving distance, the position and the height thereof. The connecting members may be block-shaped. Specifically, the blocks may include horizontal blocks 84*a* and vertical blocks 85*b*.

In this instance, a through hole 87 may be formed in one of the horizontal blocks and the electric power may be supplied to the moving contact 81 via a power line passing through the through hole.

Meanwhile, the connecting member 84 may be disposed between the safety plate 85 and the moving contact receiving part 82. The connecting member 84 may perform an insulation function for both of them. For that, the connecting member may be formed of a ceramic material.

FIG. 11 shows an entire appearance of the power supplier 80. The power supplier 80 may include a base 89*a*, a moving generation part 89*b* and a moving contact part 89*c*. Specifically, the base 89*a* and the moving generation part 89*b* may not be exposed outside. As a result, FIG. 10 shows that only the moving contact part 89*c* is exposed within the chamber. In other words, a line referenced to as '1*a*' means a boundary between the inside of the chamber and an internal wall of the chamber.

Such the configuration may minimize the area occupied by the power supplier 80 provided in the chamber. In other words, the moving generation part 89*b* is not exposed to the inside of the chamber and the moving contact part may be moved stably accordingly.

The power supplier 80 may include a safety switch 83. Such a safety switch 83 may be functioned as a switch configured to apply or block an electric power according to the movement of the moving contact part. In other words, the safety switch 83 may be moved by the safety plate 85. When the moving contact part advances forwardly, the safety switch 83 may not contact with the safety plate. Reversely, when the moving contact part retreats, the safety plate may contact with the safety switch to retreat the safety switch.

As a result, the safety switch 83 may be movable between a front position and a rear position by the safety plate 85. Specifically, the switch member 83*a* of the safety switch 83 may be moved between the front position and the rear position by the safety plate 85.

In the rear position of the safety switch, the power supplier 80 blocks the electric power applied to the moving contact part. As a result, even when the controller controls the power supplier to apply the electric power, the power supply can be substantially blocked by the safety switch. Accordingly, more stable and safe power supply may be enabled.

Meanwhile, there may be formed a region having the electric power applied thereto in the moving contact part 89*a*. When the moving contact part is exposed to the inside of the chamber, a functional film might be formed on a surface of the moving contact part 89*a*. To prevent the unnecessary functional film, a cover 89*d* may be provided.

The cover may cover a top and sides, that is, a top surface and lateral surfaces of the moving contact part. A front surface of the moving contact part may be open to move the moving contact. Also, a rear surface of the moving contact part may be closed but the rear surface faces the inner wall 1a. Accordingly, the rear surface needs not be closed.

A sealing member 88 may be provided between the moving contact part and the moving generation part. In other words, sealing may be provided to the inner wall 1*a*, to partition the chamber inside and the inner wall. As a result, the sealing may be performed by using an insulating material, to prevent the electric power applied to the moving contact part from being applied to the moving generation part.

According to the embodiment of the invention described above, the control unit 500 may appropriately control the precursor supply unit 400, the reaction gas supply unit 300, the cleaning gas supply unit 200 and the exhaustion unit 100 connected with the single chamber 1. Accordingly, the functional film may be formed on the heat exchanger 5. Furthermore, the multi-functional precursor having the corrosion resistance, hydrophilicity and antibiotic functions at the same time may be used. Accordingly, the corrosion resistant, hydrophilic and antibiotic functional film may be formed in the single chamber 1 at one time.

The heat exchanger is presented in the embodiments mentioned above and the embodiments of the invention are not limited to the heat exchanger. For example, a side mirror for a vehicle can be applied to the embodiments of the invention.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A plasma enhanced chemical vapor deposition apparatus comprising:
a chamber in which plasma reaction is performed to provide a functional film to an object received therein; a pallet mechanically and electrically connected with the object; a conveyer to convey the pallet to an inside from an outside of the chamber; and a power supplier to supply an electric power to the pallet, the power supplier comprising a moving contact that is distant from the pallet when the pallet is being conveyed and moves to contact the pallet to supply the electric power to the pallet when the pallet is stopped, wherein the pallet comprises a pallet contact that selectively touches a surface of the moving contact when the pallet is stopped, wherein the power supplier includes: a base; an air piston that is coupled to the base and provides a force; a moving contact assembly that is coupled to the air piston and selectively moves toward the pallet contact based on receiving the force from the air piston, the moving contact assembly including: a plurality of connecting members, including a horizontal connecting member and a vertical connecting member; a shaft that extends through an opening in the vertical connecting member and is coupled at a first axial end to the moving contact; a spring that is provided around the shaft and is connected to moving contact to provide an elastic force toward the pallet contact; a safety plate that is provided at a second axial end of the shaft;
a safety switch that is provided on the horizontal connecting member to selectively apply or cut off the electric power to the moving contact; and wherein, when the moving contact touches the pallet contact, the air piston continues to apply the force to the moving contact assembly such that the connecting members continues a movement toward the pallet contact while a movement of moving contact is limited by contacting the pallet, and the continued movement of the connecting members relative to the limited movement of the moving contact causes the shaft to move the safety plate relative to the horizontal connecting member to operate the safety switch.

2. The apparatus according to claim 1, wherein the pallet comprises a fixing part to fix the object thereto.

3. The apparatus according to claim 1, wherein the safety switch selectively applies the electric power to the moving contact based on a distance between the moving contact and the pallet contact.

4. The apparatus according to claim 3, wherein the safety switch of the power supplier is moved to apply power based on a movement distance of the safety plate.

5. The apparatus according to claim 4, wherein the safety switch comprises a portion that makes contact with the safety plate, the portion being formed of a ceramic material.

6. The apparatus according to claim 1, wherein the power supplier further includes a moving contact receiving part to receive the moving contact therein, and wherein the spring provided in the moving contact receiving part.

7. The apparatus according to claim 6, wherein the first axial end of the shaft extends through the moving contact receiving part and the second axial end is connected with a power line, to be selectively connected with the moving contact by the safety switch.

8. The apparatus according to claim 6, wherein the vertical connection member is formed of a ceramic material to perform insulation between the moving contact receiving part and the safety plate.

9. The apparatus according to claim 6, wherein the moving contact assembly is integrally moving, and the moving contact is relatively moving with respect to the moving contact receiving part.

10. The apparatus according to claim 1, wherein the base and the air piston are provided in an inner wall of the chamber, and the moving contact assembly is exposed to an inside of the chamber.

11. The apparatus according to claim 10, further comprising:
 a cover to cover a top and a side of the moving contact assembly exposed within the chamber.

\* \* \* \* \*